(12) United States Patent
Yasuda et al.

(10) Patent No.: US 12,519,461 B2
(45) Date of Patent: Jan. 6, 2026

(54) TDC APPARATUS, DISTANCE MEASURING APPARATUS, AND DISTANCE MEASURING METHOD

(71) Applicant: HOKUYO AUTOMATIC CO., LTD., Osaka (JP)

(72) Inventors: Kunihiro Yasuda, Osaka (JP); Toshihiro Kamitani, Osaka (JP)

(73) Assignee: HOKUYO AUTOMATIC CO., LTD., Osaka (JP)

( * ) Notice: Subject to any disclaimer, the term of this patent is extended or adjusted under 35 U.S.C. 154(b) by 287 days.

(21) Appl. No.: 18/561,023

(22) PCT Filed: May 11, 2022

(86) PCT No.: PCT/JP2022/019892
§ 371 (c)(1),
(2) Date: Nov. 15, 2023

(87) PCT Pub. No.: WO2022/244656
PCT Pub. Date: Nov. 24, 2022

(65) Prior Publication Data
US 2024/0146291 A1 May 2, 2024

(30) Foreign Application Priority Data
May 17, 2021 (JP) .................. 2021-083391

(51) Int. Cl.
*G11C 16/04* (2006.01)
*G01S 7/4865* (2020.01)
(Continued)

(52) U.S. Cl.
CPC .............. *H03K 5/14* (2013.01); *G01S 7/4865* (2013.01); *G01S 7/497* (2013.01); *G01S 17/14* (2020.01)

(58) Field of Classification Search
CPC ......... G01S 17/14; G01S 7/4865; G01S 7/497
See application file for complete search history.

(56) References Cited

U.S. PATENT DOCUMENTS 10,263,625 B1   4/2019   Tokairin
10,962,933 B1*  3/2021   Waltari .................. H03M 1/164
(Continued)

FOREIGN PATENT DOCUMENTS

JP    2012-114716 A    6/2012
JP    2019-27843 A     2/2019
(Continued)

OTHER PUBLICATIONS

Aug. 2, 2022 International Search Report issued in International Patent Application No. PCT/JP2022/019892.

*Primary Examiner* — Pho M Luu
(74) *Attorney, Agent, or Firm* — Oliff PLC

(57) ABSTRACT

A TDC apparatus includes a TDC circuit having a delay circuit including a plurality of stages of delay elements that sequentially delay a measurement signal, and a plurality of storage elements configured to respectively hold outputs of the plurality of stages of delay elements in response to a measurement clock input thereto, an edge detection unit configured to detect a detection stage of a delay element, among the plurality of stages of delay elements, that detects at least a rising edge of the measurement signal, based on switching of outputs of the plurality of storage elements, a time calculation unit configured to output a delay time of the measurement signal, and a delay unit configured to delay the measurement signal input thereto and input the delayed measurement signal to the delay circuit of the TDC circuit.

19 Claims, 19 Drawing Sheets

(51) Int. Cl.
  *G01S 7/497*   (2006.01)
  *G01S 17/14*   (2020.01)
  *H03K 5/14*    (2014.01)

(56)          References Cited

U.S. PATENT DOCUMENTS

2008/0297208 A1\*  12/2008  Baudin ................... H03L 7/091
                                                          327/107
2010/0141316 A1    6/2010  Weltin-Wu et al.
2017/0085365 A1\*  3/2017   Ravi ....................... H04L 7/042
2019/0033431 A1    1/2019  Haneda et al.
2020/0209395 A1    7/2020  Ohnaka et al.

FOREIGN PATENT DOCUMENTS

JP         2019-49430 A     3/2019
JP         2019-161442 A    9/2019

\* cited by examiner

TDC APPARATUS, DISTANCE MEASURING APPARATUS, AND DISTANCE MEASURING METHOD

TECHNICAL FIELD

The present invention relates to a TDC apparatus, a distance measuring apparatus and a distance measuring method.

BACKGROUND ART

As a distance measuring method for measuring the distance to a target, a TOF (Time-of-Flight) method is used, for example. A distance measuring apparatus that utilizes the ToF method is able to measure the distance to a target, by detecting the flight time of light from emission of light toward the target to reception of reflected light.

An example of a known distance measuring apparatus that utilizes the ToF method is an apparatus that detects the flight time of light using a TDC (time-to-digital converter) circuit. TDC circuits digitize time information. These TDC circuits often utilize a method that uses delay elements and flip-flops. In such TDC circuits, the delay amount (delay time) of the delay elements varies depending on factors such as variances in the manufacturing process, changes in the supply voltage and temperature changes during operation (so-called PVT (Process Voltage Temperature) variations). The measurement accuracy of the distance measuring apparatus is affected when the delay amount of the delay elements of the TDC circuit varies.

In view of this, heretofore, a technology that involves calibrating the TDC circuit at a timing at which the distance measurement operation is not performed in the distance measuring apparatus has been proposed. For example, Patent Document 1 discloses a technique for correcting variability in the delay amount of the delay elements, such that the TDC circuit operates normally with respect to PVT variations. With the technique described in Patent Document 1, the delay amount of the delay elements is adjusted by adjusting the bias current applied to the delay elements.

LIST OF RELATED ART DOCUMENTS

Patent Document

Patent Document 1: Japanese Patent Laid-Open Publication No. 2012-114716

SUMMARY OF INVENTION

Problems to be Solved by the Invention

In a measuring apparatus (e.g., distance measuring apparatus) provided with a TDC circuit, a delay conversion table is generated or the delay amount of each delay element stored in the delay conversion table is corrected, by performing calibration, for example. Incidentally, the calibration operation is desirably completed in the shortest possible time, since the distance measurement operation cannot be performed when the calibration operation is performed. Thus, in the calibration operation, an extremely large number of pulses (calibration signals) need to be input to the TDC circuit in a shorter period of time than during the measurement operation.

When the distance measurement operation and the calibration operation are performed in the distance measuring apparatus, a voltage drop by which the supply voltage value of the TDC circuit falls below a predetermined voltage value occurs. In particular, during the calibration operation in which pulses are continuously input to the TDC circuit in a short period of time, the voltage drop amount is larger than during the measurement operation. That is, the voltage drop amount of the TDC circuit during the calibration operation differs from the voltage drop amount during the measurement operation. This difference in voltage drop amount causes the delay amount of the delay elements during the calibration operation to differ from the delay amount during the measurement operation. As a result, even if the TDC circuit is calibrated prior to the distance measuring operation, there is a risk of not being able to perform proper distance measurement.

Generally, the voltage drop amount of the supply voltage of the TDC circuit during the measurement operation is smaller than the voltage drop amount of the supply voltage of the TDC circuit during the calibration operation, and thus the delay amount of the delay elements of the TDC circuit during the measurement operation is smaller than the delay amount of the respective delay elements of the TDC circuit during the calibration operation. Thus, a difference (error) occurs in each delay element between the actual delay amount of the delay element during the measurement operation and the delay amount of the delay element during the calibration operation. Accordingly, even if calibration is performed, it is difficult to accurately correct the delay amounts of a plurality of delay elements. Note that, depending on the conditions, the voltage drop amount of the supply voltage of the TDC circuit during the measurement operation can be larger than the voltage drop amount during the calibration operation, but in this case also, a difference (error) similarly occurs in each delay element between the actual delay amount of the delay element during the measurement operation and the delay amount of the delay element during the calibration operation.

When calculating the delay time of the measurement signal in the TDC circuit during the measurement operation, a cumulative delay amount that is obtained by summing the delay amounts of the delay elements corrected by the calibration operation is used, for example. Because an error occurs in each delay element between the actual delay amount of the delay element during the measurement operation and the delay amount of the delay element during the calibration operation, due to variation in the voltage drop amount of the supply voltage of the TDC circuit, as described above, an error also occurs in the cumulative delay amount that is used when calculating the delay time of the measurement signal. Here, the error that occurs when calculating the delay time of the measurement signal in the TDC circuit increases, the later the detection stage of the delay elements that detect the rise of the measurement signal.

In view of the above, an example object of the invention is to provide a TDC apparatus, a distance measuring apparatus and a distance measuring method that are able to improve measurement accuracy while reducing the influence of variation in the voltage drop amount of the supply voltage of a TDC circuit.

Means for Solving the Problems (1) In order to achieve the above object, a TDC apparatus according to an example aspect of the invention includes: a TDC circuit having a delay circuit including a plurality of stages of delay elements configured to sequentially delay a measurement signal and a plurality of storage elements provided in correspondence with the plurality of stages of delay elements and configured to respectively hold outputs of the plurality of stages of delay elements in response to a measurement clock input thereto; an edge detection unit configured to detect a detection stage of a delay element, among the plurality of delay elements, that detects at least a rising edge of the measurement signal, based on switching of outputs of the plurality of storage elements; a time calculation unit configured to output a delay time of the measurement signal, based on the detection stage of the delay element and a delay conversion table relating to a delay amount of the plurality of delay elements; and a delay unit configured to delay the measurement signal input thereto and input the delayed measurement signal to the delay circuit of the TDC circuit.

In the invention, the measurement signal input to the TDC apparatus is input to the TDC circuit after being delayed by the delay unit. In this case, the detection stage of the delay element that detects the rise of the measurement signal can be set to an earlier stage, depending on the amount by which the measurement signal is delayed in the delay unit, for example. The difference (error) between the actual cumulative delay amount of the plurality of delay elements during the measurement operation and the cumulative delay amount of the plurality of delay elements during the calibration operation can thereby be reduced. As a result, measurement accuracy can be improved while reducing the influence of variation in the voltage drop amount of the TDC circuit.

A method such as the following is also conceivable as a method for utilizing the invention to reduce the error between the actual cumulative delay amount during the measurement operation and the cumulative delay amount during the calibration operation. For example, it is conceivable to provide a plurality of measurement channels (channels for measuring the delay time of the measurement signal with the TDC circuit, edge detection unit, and time calculation unit) in the TDC apparatus, and to provide a delay unit in at least one of the measurement channels. In this case, by setting the delay amount in the delay unit as appropriate, the detection stage of the delay element that detects the rise of the measurement signal on one measurement channel will be different from the detection stage of the delay element that detects the rise of the measurement signal on another measurement channel. It can thereby be expected that, even if the detection stage of the delay element in any of the measurement channels is a later stage and the calculation result includes a large error, the detection stage of the delay element in other measurement channels will be an earlier stage and the error included in the calculation result will be smaller.

(2) The TDC apparatus of (1) above may further include a plurality of measurement channels each having the TDC circuit, the edge detection unit, and the time calculation unit; an input unit configured to input the same measurement signal in parallel to the plurality of measurement channels; and a delay time determination unit configured to determine one delay time based on a plurality of delay times of the measurement signal calculated by the time calculation units of the plurality of measurement channels, and at least one of the plurality of measurement channels may have the delay unit configured to delay the measurement signal input from the input unit, with respect to the measurement signal that is input to the delay circuit of the TDC circuit of another of the measurement channels.

With this TDC apparatus, the input timing at which the measurement signal is input to the TDC circuit of one measurement channel can be shifted with respect to the input timing at which the measurement signal is input to the TDC circuit of another measurement channel. The detection stage of the delay element that detects the rise of the measurement signal in the TDC circuit of the one measurement channel and the detection stage of the delay element that detects the rise of the measurement signal in the TDC circuit of the other measurement channel are thereby changed. The delay time determination unit is then able to determine one delay time based on the delay time of the measurement signal calculated by the time calculation unit of each measurement channel.

In this case, it can be expected that, even if the detection stage of the delay element that detects the rise of the measurement signal in the TDC circuit of one measurement channel is a later stage and the calculation result includes a large error, the detection stage of the delay element that detects the rise of the measurement signal in the TDC circuit of other measurement channels will be an earlier stage and the error included in the calculation result will be smaller. Accordingly, as described above, due to the delay time determination unit determining the one delay time based on the delay time of the measurement signal calculated by the time calculation unit of each measurement channel, the influence of error can be reduced.

(3) In the TDC apparatus of (2) above, two or more measurement channels, among the plurality of measurement channels, may each have the delay unit, and each delay unit may delay the measurement signal input from the input unit for a different time from the other delay units and input the delayed measurement signal to the delay circuit of the TDC circuit.

According to the TDC apparatus of (3) above, the input timing of the measurement signal that is input to the TDC circuit of each measurement channel can also be shifted with respect to the input timing of the measurement signal that is input to the TDC circuit of the other measurement channels, in the case where three or more measurement channels are provided. It can thereby be expected that, even if the detection stage of the delay element that detects the rise of the measurement signal of one of the measurement channels in the TDC circuit is a later stage and the calculation result includes a large error, the detection stage of the delay element that detects the rise of the measurement signal in the TDC circuit of other measurement channels will be an earlier stage and the error included in the calculation result will be smaller.

(4) In the TDC apparatus of (2) or (3) above, the delay time determination unit may output, as the one delay time, an average value of the plurality of delay times calculated by the plurality of measurement channels.

In this case, the influence of error that is included in the delay e calculated by each measurement channel can be reduced.

(5) In the TDC apparatus of (2) or (3) above, the delay time determination unit may output, as the one delay time, the delay time calculated by the measurement channel in which the detection stage of the delay element that detects the rising edge in the TDC circuit is an earliest stage, among the plurality of measurement channels.

In this case, the delay time that is considered to have the smallest error can be output as the one delay time, from among the plurality of delay times calculated by the plurality of measurement channels.

(6) The TDC apparatus of any of (1) to (5) above may further include a time correction unit configured to correct the delay time calculated by the time calculation unit or the one delay time determined by the delay time determination unit, according to a delay in the delay unit, and output the corrected delay time of the measurement signal.

In this case, the time correction unit is able to remove the influence of delay of the measurement signal in the delay unit from the delay time calculated by the time calculation unit or from the one delay time determined by the delay time determination unit.

(7) The TDC apparatus of any of (1) to (6) above may be for use in a distance measuring apparatus configured to measure a distance to an object based on a measurement clock and a measurement signal related to reflected light of measurement light emitted onto the object, and may further include a distance calculation unit configured to calculate a distance to the object, with the delay time of the measurement signal as a time difference between the measurement light and the reflected light.

In this case, the distance measuring apparatus is able to accurately measure the distance to the object while reducing the influence of variation in the voltage drop amount of the TDC circuit between the calibration operation and the measurement operation.

(8) The TDC apparatus of (7) above may further include a distance correction unit configured to correct the distance calculated by the distance calculation unit according to a delay in the delay unit, and output the corrected distance.

In this case, the distance correction unit is able to remove the influence of delay of the measurement signal in the delay unit from the distance calculated by the distance calculation unit. Also, the distance measuring apparatus is able to accurately measure the distance to the object while reducing the influence of variation in the voltage drop amount in the TDC circuit between the calibration operation and the measurement operation.

(9) The TDC apparatus of (1) above may be for use in a distance measuring apparatus configured to measure a distance to an object based on a measurement clock and a measurement signal related to reflected light of measurement light emitted onto the object, and may further include a plurality of measurement channels each having the TDC circuit, the edge detection unit, the time calculation unit, and a distance calculation unit configured to calculate the distance to the object, with the delay time of the measurement signal output by the time calculation unit as a time difference between the measurement light and the reflected light; an input unit configured to input the same measurement signal in parallel to the plurality of measurement channels; and a distance determination unit configured to determine one distance to the object based on a plurality of distances calculated by the distance calculation units of the plurality of measurement channels, and at least one of the plurality of measurement channels may have the delay unit configured to delay the measurement signal input from the input unit, with respect to the measurement signal that is input to the delay circuit of the TDC circuit of another of the measurement channels.

With this TDC apparatus, the input timing at which the measurement signal is input to the TDC circuit of one measurement channel can be shifted with respect to the input timing at which the measurement signal is input to the TDC circuit of another measurement channel. The detection stage of the delay element that detects the rise of the measurement signal in the TDC circuit of the one measurement channel and the detection stage of the delay element that detects the rise of the measurement signal in the TDC circuit of the other measurement channel are thereby changed. The distance determination unit is then able to determine one distance based on the distance to the object calculated by the distance calculation unit of each measurement channel.

In this case, it can be expected that, even if the detection stage of the delay element that detects the rise of the measurement signal in the TDC circuit of one measurement channel is a later stage and the calculation result includes a large error, the detection stage of the delay element that detects the rise of the measurement signal in the TDC circuit of other measurement channels will be an earlier stage and the error included in the calculation result will be smaller. Accordingly, as described above, due to the distance determination unit determining the one distance based on the distance to the object calculated by the distance calculation unit of each measurement channel, the influence of error can be reduced.

(10) In the TDC apparatus of (9) above, two or more measurement channels, among the plurality of measurement channels, may each have the delay unit, and each delay unit may delay the measurement signal input from the input unit for a different time from the other delay units and input the delayed measurement signal to the delay circuit of the TDC circuit.

According to the TDC apparatus of (10) above, the input timing of the measurement signal that is input to the TDC circuit of each measurement channel can also be shifted with respect to the input timing of the measurement signal that is input to the TDC circuit of the other measurement channels, in the case where three or more measurement channels are provided. It can thereby be expected that, even if the detection stage of the delay element that detects the rise of the measurement signal of one of the measurement channels in the TDC circuit is a later stage and the calculation result includes a large error, the detection stage of the delay element that detects the rise of the measurement signal in the TDC circuit of other measurement channels will be an earlier stage and the error included in the calculation result will be smaller.

(11) In the TDC apparatus of (9) or (10) above, the distance determination unit may output, as the one distance, an average value of the plurality of distances calculated by the plurality of measurement channels.

In this case, the influence of error that is included in the distance to the object calculated by each measurement channel can be reduced.

(12) In the TDC apparatus of (9) or (10) above, the distance determination unit may output, as the one distance, the distance calculated by the measurement channel in which the detection stage of the delay element that detects the rising edge in the TDC circuit is an earliest stage, among the plurality of measurement channels.

In this case, the distance that is considered to have the smallest error can be output as the one distance, from among the plurality of distances calculated by the plurality of measurement channels.

(13) In the TDC apparatus of any of (9) to (12) above may further include a distance correction unit configured to correct the distance calculated by the distance calculation unit or the one distance determined by the distance determination unit, according to a delay in the delay unit, and output the corrected distance.

In this case, the distance correction unit is able to remove the influence of delay of the measurement signal in the delay unit, by correcting the distance to the object calculated by the distance calculation unit or the one distance determined by the distance determination unit, according to the delay in the delay unit.

(14) In the TDC apparatus of any of (9) to (12) above, the distance calculation unit may calculate a distance to a reference object positioned at a specific distance, based on a measurement signal related to reflected light from the reference object, set a zero point for distance measurement based on the calculated distance, and calculate a distance to the target based on the set zero point.

With this TDC apparatus, the distance to the target can be appropriately calculated by the distance calculation unit, without correcting the delay time of the measurement signal calculated by the time calculation unit. Accordingly, a correction unit for correcting the delay time of the measurement signal calculated by the time calculation unit need not be provided, thus enabling the configuration of the TDC apparatus to be simplified.

(15) In the TDC apparatus of any of (1) to (14) above, the delay unit may be configured to be capable of changing the delay time by which the measurement signal is delayed.

In this case, the delay time of the delay unit can be adjusted according to factors such as the usage environment of the apparatus, thus enabling the influence of variation in the voltage drop amount of the TDC circuit to be more appropriately reduced.

(16) In the TDC apparatus of (1) above, the delay unit may be configured to be capable of changing the delay time by which the measurement signal is delayed, and the TDC apparatus may further include a delay time determination unit configured to determine one delay time based on a plurality of delay times calculated by the time calculation unit, due to performing measurement multiple times while changing the delay time in the delay unit.

In this case, by performing measurement multiple times while changing the delay time in the delay unit, the influence of error can be reduced, similarly to the case where a plurality of measurement channels are provided. Specifically, the influence of error can be reduced by taking the average value of the distances obtained by performing measurement multiple times or by employing the distance measured at the time at which the detection stage of the delay element that detects the edge is an earliest stage among the distances obtained by performing measurement multiple times.

(17) A distance measuring apparatus according to an example aspect of the invention includes the TDC apparatus of any of (1) to (16) above; a light projecting unit configured to emit measurement light in synchronization with the measurement clock; and a light receiving unit configured to receive reflected light of the measurement light reflected by an object, and output a measurement signal related to the reflected light to the TDC apparatus.

With this distance measuring apparatus, the distance to the object can be accurately measured while reducing the influence of variation in the voltage drop amount of the TDC circuit between the calibration operation and the measurement operation.

(18) The distance measuring apparatus of (17) above may further include at least one of a light deflection unit configured to cause the measurement light emitted from the light projecting unit to be changed in a predetermined direction; and a light scanning unit configured to cause scanning of the measurement light to be scanned in a predetermined direction.

In this case, the orientation of the measurement light can be changed or scanning of the measurement light can be performed in a predetermined direction.

(19) A distance measuring method according to an example aspect of the invention is a distance measuring method for measuring a distance to an object in a distance measuring apparatus that includes a TDC circuit having a delay circuit including a plurality of stages of delay elements configured to sequentially delay a measurement signal related to relected light of measurement light emitted onto the object and a plurality of storage elements provided in correspondence with the plurality of stages of delay elements and configured to respectively hold outputs of the plurality of stages of delay elements in response to a measurement clock input thereto, the method including delaying the measurement signal and inputting the delayed measurement signal to the delay circuit of the TDC circuit; detecting a detection stage of a delay element, among the plurality of delay elements, that detects at least a rising edge of the measurement signal based on switching of outputs of the plurality of storage elements; calculating a delay time of the measurement signal based on the detection stage of the delay element and a delay conversion table relating to a delay amount of the plurality of delay elements; and calculating a distance to the object, with the delay time of the measurement signal as a time difference between the measurement light and the reflected light.

With this distance measuring method, similarly to the TDC apparatus described in (7) above, the distance to the object can be accurately measured while reducing the influence of variation in the voltage drop amount of the TDC circuit between the calibration operation and the measurement operation.

Advantageous Effects of the Invention

According to the invention, measurement accuracy can be improved while reducing the influence of variation in the voltage drop amount of the supply voltage of a TDC circuit.

EXAMPLE EMBODIMENTS

Hereinafter, a TDC apparatus and a distance measuring apparatus according to example embodiments of the invention will be described using the drawings.

First Example Embodiment

Figure 1:
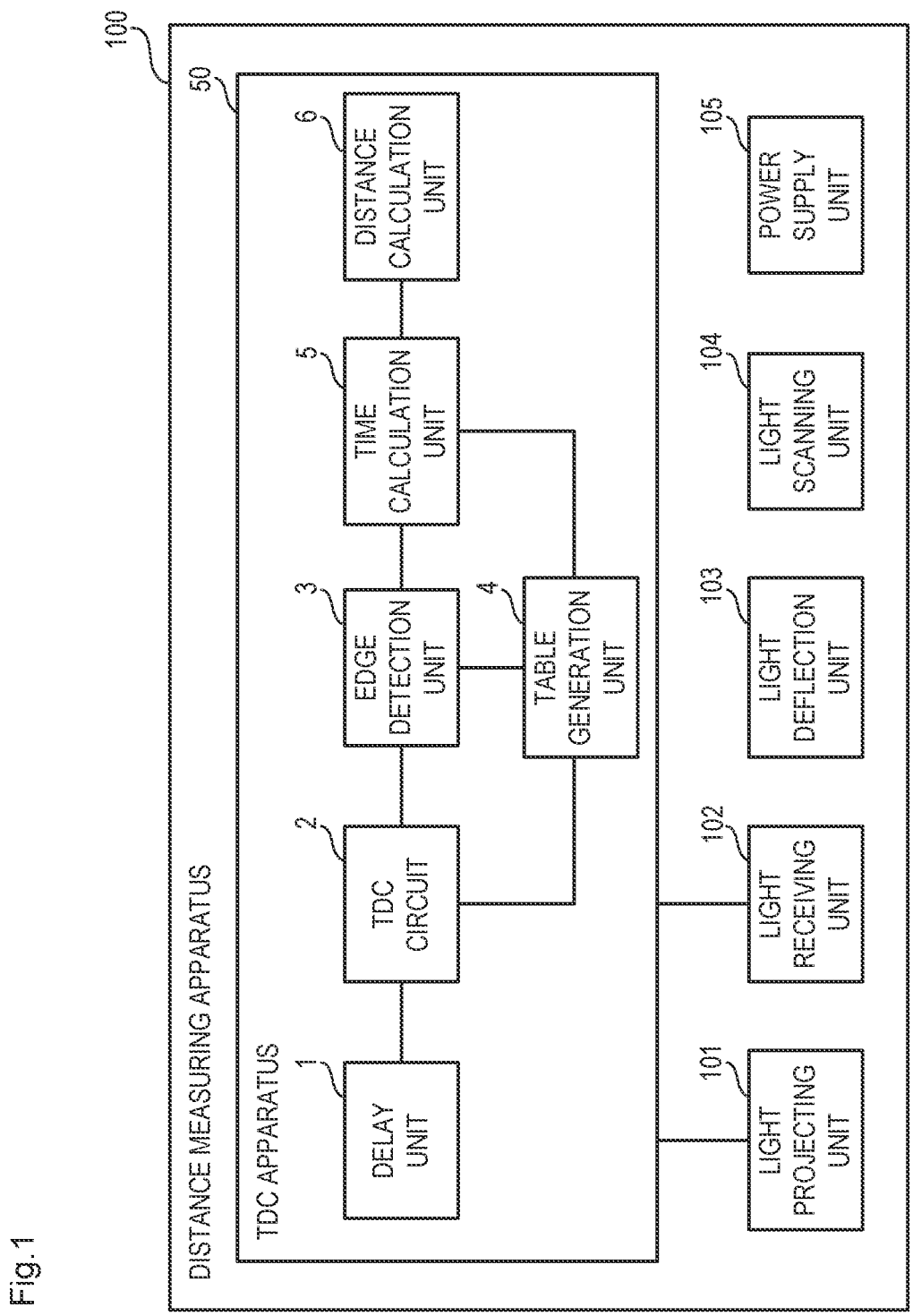
FIG. 1 is a block diagram showing the configuration of a distance measuring apparatus provided with a TDC apparatus according to a first example embodiment.

FIG. 1 is a block diagram showing the configuration of a distance measuring apparatus provided with a TDC apparatus according to a first example embodiment of the invention.

A distance measuring apparatus 100 according to the present example embodiment emits measurement light onto an object targeted for measurement (hereinafter, target), receives reflected light resulting from the measurement light being reflected by the target, and calculates the distance to the target based on the timing at which the reflected light is received. In the present example embodiment, the distance measuring apparatus 100 is provided with a TDC apparatus 50, a light projecting unit 101, a light receiving unit 102, a light deflection unit 103, a light scanning unit 104, and a power supply unit 105. The TDC apparatus 50 will be described in detail later.

The light projecting unit 101 is, for example, provided with a light source and a light source drive unit not shown. The light source is, for example, a semiconductor laser or an LED. The light source drive unit is a circuit that drives light emission of the light source. The light projecting unit 101 emits measurement light toward a reflective part of the light deflection unit 103 described later. The measurement light is pulsed light having a pulse width from several nanoseconds to several tens of nanoseconds, for example.

The light receiving unit 102 is, for example, provided with a light receiving element such as an avalanche photodiode, and is configured to receive the reflected light of the measurement light reflected by the target and convert the light intensity of the reflected light that is received into an electrical signal. When reflected light is received, the light receiving unit 102 outputs an electrical signal (hereinafter, measurement signal) related to the reflected light to the TDC apparatus 50.

A reflective part such as a mirror is disposed in the light deflection unit 103 and measurement light from the light projecting unit 101 that is incident on the reflective part is deflected in a predetermined direction. The light scanning unit 104 causes scanning of the measurement light deflected by the light deflection unit 103 to be performed in a predetermined direction such as horizontally or vertically, for example. Note that the distance measuring apparatus 100 may be configured to include only one of the light deflection unit 103 and the light scanning unit 104.

The power supply unit 105 outputs a predetermined supply voltage to the TDC apparatus 50, the light projecting unit 101, the light receiving unit 102, the light deflection unit 103 and the light scanning unit 104 that are provided in the distance measuring apparatus 100 in order to supply power for the respective units to operate. Note that the power supply unit 105 may also be provided with an input terminal to which power is supplied from outside the distance measuring apparatus 100.

The TDC apparatus 50 measures the time difference between the measurement light and the reflected light as a delay time from the time that a measurement start signal corresponding to the measurement light is input until the time that the measurement signal corresponding to the reflected light is detected. Hereinafter, the IDC apparatus 50 will be described in detail.

In the present example embodiment, the TDC apparatus 50 is provided with a delay unit 1, a TDC circuit 2, an edge detection unit 3, a table generation unit 4, a time calculation unit 5, and a distance calculation unit 6. These units may be configured by dedicated hardware, and constituent elements realizable by software may be realized by a CPU executing a program.

The delay unit 1 delays the measurement signal input to the TDC apparatus 50 from the light receiving unit 102 and inputs the delayed measurement signal to the first delay circuit 11 (see FIG. 2) described later of the TDC circuit 2. In the present example embodiment, the delay unit 1 includes a delay element not shown, and is configured to delay the measurement signal input to the TDC apparatus 50 from the light receiving unit 102 for a shorter time than the period of the measurement clock and input the delayed measurement signal to the TDC circuit 2. Note that the measurement clock is for detecting the time difference (delay time of measurement signal) between the emission time (projection time) of measurement light and the reception time of reflected light.

Figure 2:
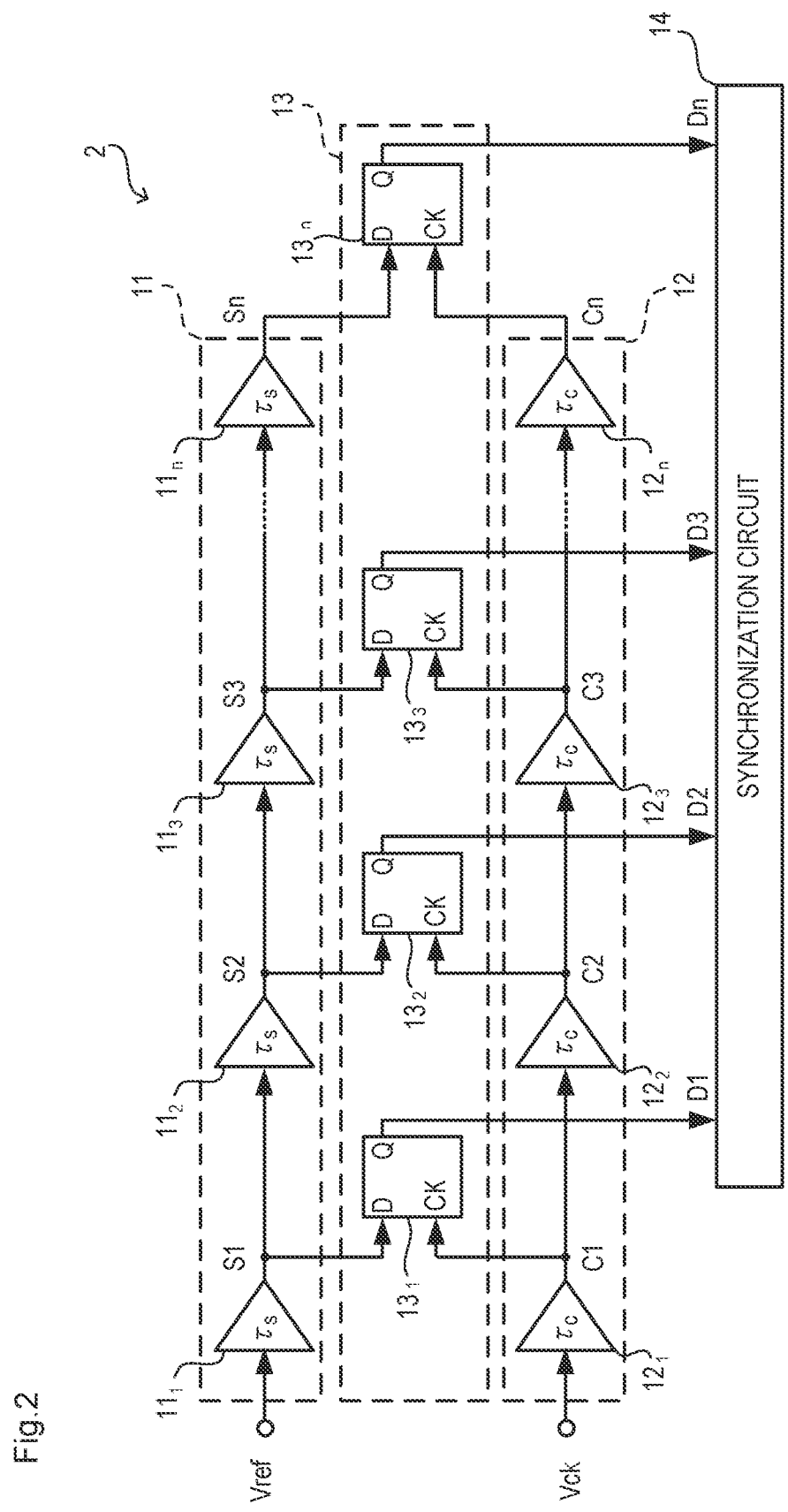
FIG. 2 shows a TDC circuit.

FIG. 2 shows the TDC circuit 2. The TDC circuit 2 shown in FIG. 2 is a so-called vernier TDC circuit. The TDC circuit 2 has a first delay circuit 11, a second delay circuit 12, a flip-flop array 13, and a synchronization circuit 14. Note that the TDC circuit 2 may also be a flash TDC circuit that is not provided with the second delay circuit 12. The flip-flop array 13 is an example of a memory element capable of high-speed operation.

In the first delay circuit 11, the measurement signal is input to an input terminal Vref. As described above, the measurement signal is a signal based on reflected light received by the light receiving unit 102 (light reflected by the target after being emitted from the light projecting unit 101). The first delay circuit 11 is constituted by n stages of delay elements $11_n$ (where n is an integer not less than 1). The delay amount (also referred to as delay time) of each delay element $11_n$ is set to $\tau_S$. The respective output nodes of the delay elements $11_n$ are represented by S1, S2, S3, ..., Sn.

In the second delay circuit 12, the measurement clock is input to an input terminal Vck. The light projecting unit 101 (see FIG. 1) emits measurement light at the timing of the rise of the measurement clock. The second delay circuit 12 is constituted by n stages of delay elements $12_n$, similarly to the first delay circuit 11. The delay amount of each delay element $12_n$ is set to $\tau_C(<\tau_S)$. The respective output nodes of the delay elements $12_n$ are represented by C1, C2, C3, ..., Cn.

A set of output terminals is connected to a flip-flop described later, for each set of a delay element $11_n$ and a delay element $12_n$, such as the set of a delay element $11_1$ and a delay element $12_1$, the set of a delay element $11_2$ and a delay element $12_2$, and so on. Hereinafter, the delay element $11_n$ and the delay element $12_n$ will be referred to as the delay elements of an nth stage, such that the delay element $11_1$ and the delay element $12_1$ are the delay elements of a first stage, the delay element $11_2$ and the delay element $12_2$ are the delay elements of a second stage, and so on.

The flip-flop array 13 is provided with n D flip-flops (hereinafter, referred to as D-FFs) $13_n$ (where n is an integer not less than 1). In the present example embodiment, a D-FF $13_1$ is provided in correspondence with the delay elements of the first stage, and a D-FF $13_n$ is provided in correspondence with the delay elements of the nth stage. Specifically, an output node Sn of the delay element $11_n$ is connected to a D terminal of the D-FF $13_n$, and an output node Cn of the delay element $12_n$ is connected to a CK terminal. Also, a Q terminal of the D-FF $13_n$ is connected to the synchronization circuit 14. The respective output nodes of the D-FFs $13_n$ are represented by D1, D2, D3, . . . , Dn.

The synchronization circuit 14 outputs the output values of the D-FFs $13_1$ to $13_n$ in synchronization with the measurement clock.

Figure 3:
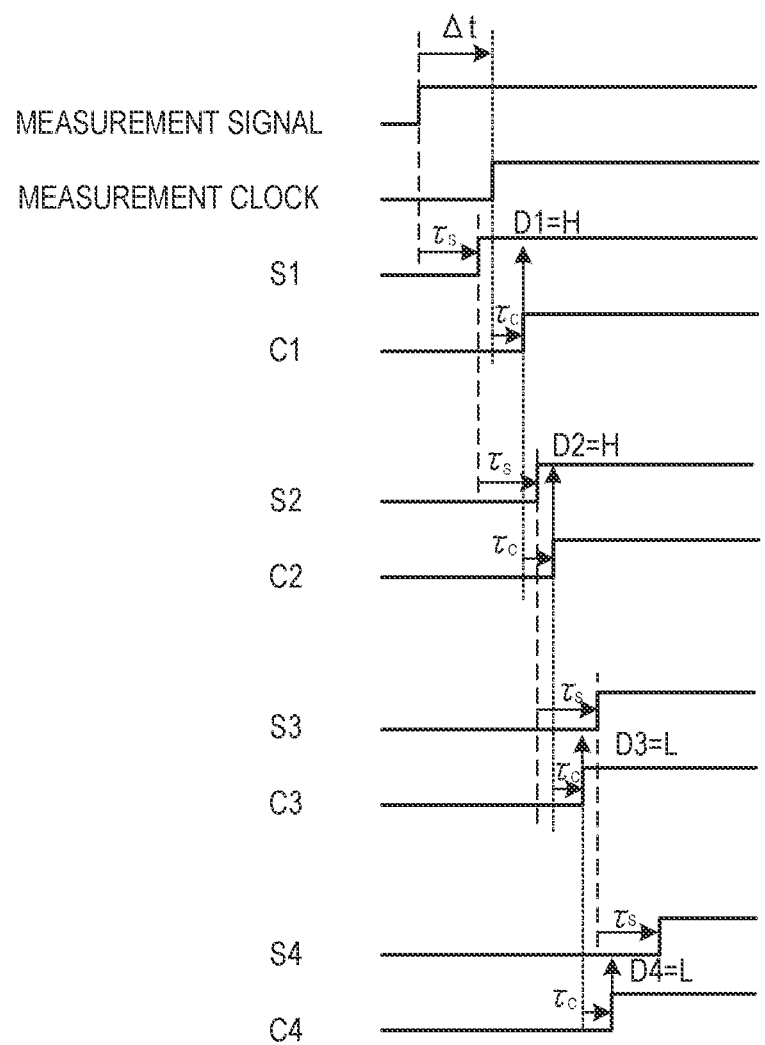
FIG. 3 shows operation waveforms of the TDC circuit in FIG. 2.
Figure 4:
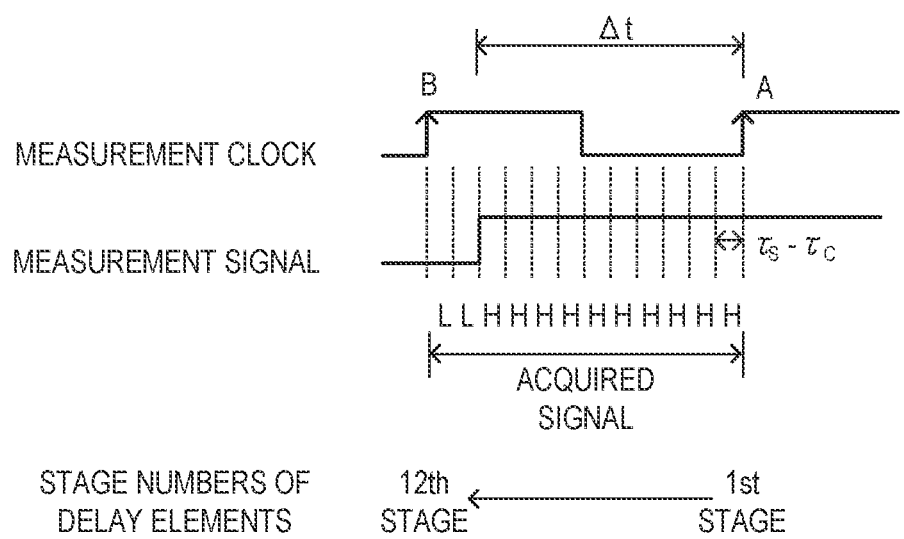
FIG. 4 shows waveforms of a measurement signal and a measurement clock that are input to the TDC circuit.

FIG. 3 shows an example of operation waveforms of the TDC circuit 2 in FIG. 2. Also, FIG. 4 shows an example of waveforms of the measurement signal and measurement clock that are input to the TDC circuit 2. In the example in FIG. 3, the measurement clock from the input terminal Vck rises from L level (hereinafter, L) to H level (hereinafter, H) after being delayed by a time difference Δt with respect to the rise of the measurement signal from the input terminal Vref from L to H. In this example shown in FIG. 3, "H, H, L, L" is obtained as data of the output nodes D1 to D4 of the D-FFs $13_1$ to $13_4$.

When the measurement signal and the measurement clock are input to the TDC circuit 2, the edge detection unit 3 detects an edge (rising edge or falling edge) of the measurement signal, based on the output values from the synchronization circuit 14. Here, in the present example embodiment, the total delay amount of the twelve stages of delay elements (i.e., n=12) of the TDC circuit 2 in FIG. 2 corresponds to one period of the measurement clock.

In this case, a measurement signal and a measurement clock such as shown in FIG. 4 are input, such that "H, H, H, H, H, H, H, H, H, H, L, L" is obtained as data of the output nodes D1 to D12 of the D-FFs $13_1$ to $13_{12}$. The edge detection unit 3 detects the rising edge of the measurement signal by detecting the change from H to L of the data of the output nodes D1 to D12.

In the present example embodiment, the edge detection unit 3 detects the detection stages of the delay elements that detect the rising edge and the falling edge of the measurement signal, based on switching of the data of the output nodes D1 to Dn. Specifically, in the present example embodiment, the edge detection unit 3 determines that, for example, the delay elements (in the example in FIG. 4, the delay elements of the eleventh stage) that are in correspondence with the output node Di at the time that the data changes from H to L, among the output nodes D1 to Dn, are the delay elements that detected the rising edge of the measurement signal. Also, the edge detection unit 3 determines that, for example, the delay elements that are in correspondence with the output node Di at the time that data changes from L to H, among the output nodes D1 to Dn, are the delay elements that detected the falling edge.

In the present example embodiment, due to the edge detection unit 3 detecting the rise of the measurement signal, the time calculation unit 5 is able to measure the time interval from when the measurement signal rises until when the measurement clock A rises, as will be described below. The time interval is derived by summing the delay amounts of the delay elements (in the present example embodiment, the difference between the delay amount of the delay element $11_n$ and the delay amount of the delay element $12_n$: $(\tau_s-\tau_c)$ (also referred to as the time resolution). In the example shown in FIG. 4, the rise of the measurement signal is detected by the delay elements of the eleventh stage. In this case, for example, the time interval from when the measurement signal rises until when the measurement clock A rises can be derived by summing the delay amounts of the delay elements from the delay elements of the first stage to the delay elements of the tenth stage (delay elements immediately before the delay elements that detect the rise).

Note that, in the example in FIG. 4, as described above, the total delay amount of the 12 stages of delay elements (i.e., n=12) corresponds to one period of the measurement clock. Thus, the time interval from the rise of a measurement clock B immediately previous to the measurement clock A to the rise of the measurement signal can be derived by summing the delay amounts of the delay elements of the eleventh stage and twelfth stage. That is, in the present example embodiment, the time interval from the rise of the measurement clock to the rise of the measurement signal can be calculated as a cumulative delay amount from the delay elements that detect the rise of the measurement signal (in FIG. 4, delay elements of eleventh stage) to the delay elements of the last stage (in FIG. 4, delay elements of twelfth stage), among the plurality of stages of delay elements corresponding to one period of the measurement clock.

The table generation unit 4 (see FIG. 1) generates a delay conversion table. The delay amount $(\tau_s-\tau_c)$ of the delay elements of each stage varies under the influence of manufacturing variances. The delay conversion table is for calibrating delay amounts that are based on the variable delay amount $(\tau_s-\tau_c)$. In the present example embodiment, the delay conversion table shows the relationship between the detection stage of the delay elements that detect the rising edge of a calibration signal described below and the cumulative delay amount of the delay elements up to that detection stage, when the calibration signal is input to the TDC circuit 2. Hereinafter, the operation for generating the delay conversion table will be referred to as a calibration operation. The table generation unit 4 performs the calibration operation at a timing at which the distance measuring apparatus 100 is not performing the distance measurement operation, that is, at a timing at which the measurement signal is not input to the TDC circuit 2.

Figure 5:
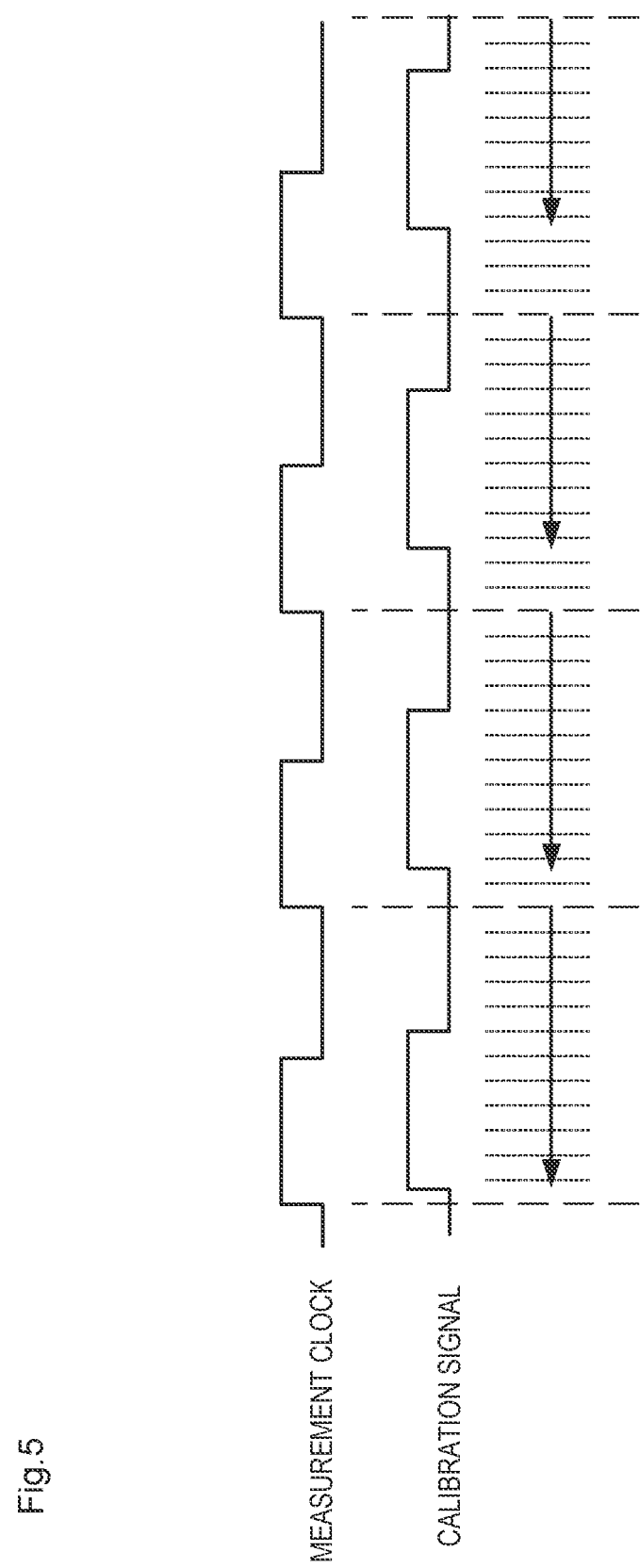
FIG. 5 shows waveforms of a calibration signal and the measurement clock.

FIG. 5 shows waveforms of the calibration signal and the measurement clock. In the calibration operation, the table generation unit 4 inputs the calibration signal to the input terminal Vref (see FIG. 2) from a clock generation circuit not shown. The measurement clock is input to the input terminal Vck. The calibration signal has a period close to the period of the measurement clock and is not in synchronization with the measurement clock. The period of the calibration signal is variable, and the difference between the period of the calibration signal and the period of the measurement clock preferably diverges from the time resolution $(\tau_s-\tau_c)$ of the TDC circuit 2. For example, in the case where the time resolution of the TDC circuit 2 is 10 [ps], the period of the calibration signal when the period of the measurement clock is 4 [ns] is preferably set in a range from larger than 4 [ns] to smaller than 4.016 [ns].

When the calibration signal is input, the table generation unit 4, as shown in FIG. 5, counts the number of rises of the detected calibration signal, for each stage of the delay elements (delay elements of 12 stages in FIG. 5) in the TDC circuit 2. In the present example embodiment, the rise of the calibration signal is detected by the edge detection unit 3, similarly to the rise of the measurement signal. The table generation unit 4 counts the number of rises of the detected calibration signal for each stage of the delay elements, based on the detection result of the edge detection unit 3.

Figure 6:
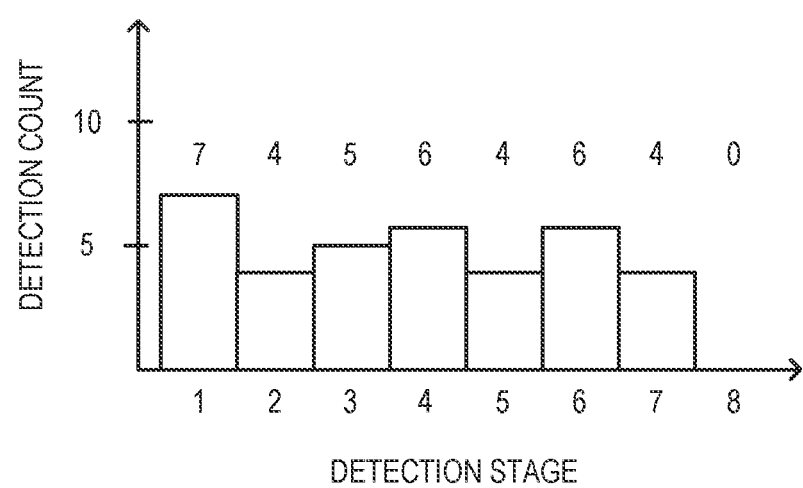
FIG. 6 is a histogram showing the result of detecting the rise of the calibration signal.

FIG. 6 is a histogram showing the result of detecting the rise of the calibration signal. The table generation unit 4 generates a histogram showing the result of detecting the rise of the calibration signal. FIG. 6 shows the result of inputting the calibration signal, such that the total number of rises of the calibration signal (hereinafter, total detection count) that are detected by the delay elements of the respective stages is "36". In FIG. 6, the number of rises of the calibration signal (hereinafter, detection count) detected by the delay elements of the first stage is "7". The detection count in the eighth stage is "0". The detection count represents the delay amount of the delay elements of each stage. For example, when the period of the measurement clock is 4 [ns], the total detection count "36" corresponds to the period 4 [ns] of that measurement clock. Thus, the delay amount of the delay elements of the first stage will be 7/36×4 [ns].

Figure 7:
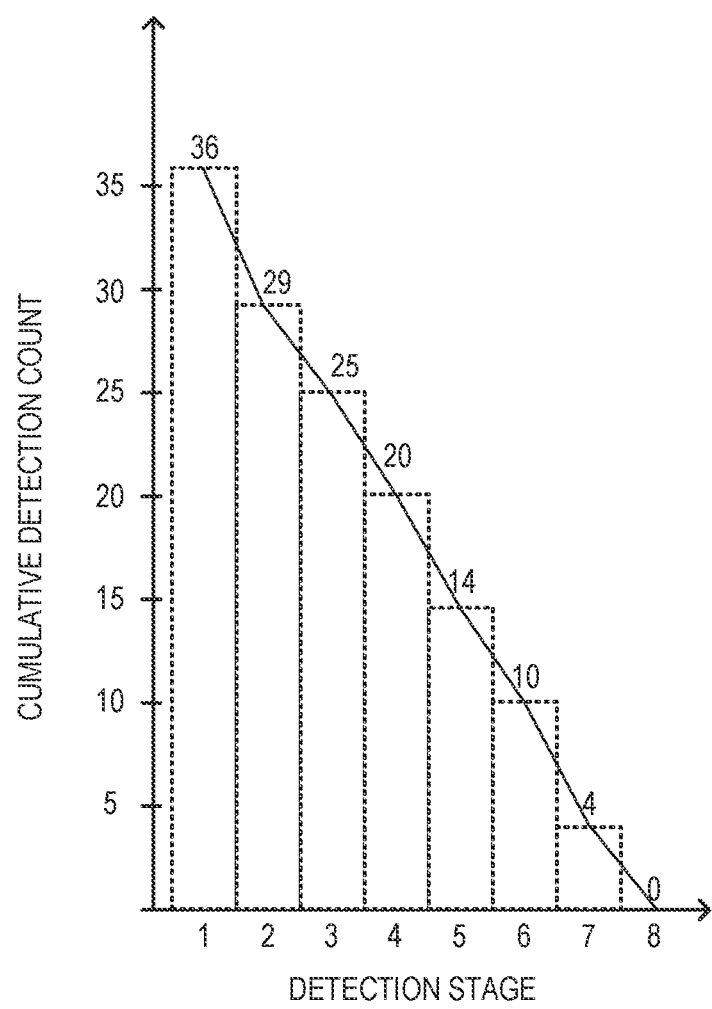
FIG. 7 shows a cumulative histogram.

Next, the table generation unit 4 generates a cumulative histogram from the histogram shown in FIG. 6, in order to estimate the cumulative delay amount of the delay elements up to each stage. FIG. 7 shows a cumulative histogram. The cumulative histogram in FIG. 7 is generated by performing a calculation that involves adding the detection count of the eighth stage which is the last stage to the detection count of the seventh stage, adding the added detection count of the seventh stage to the detection count of the sixth stage, and so on in order from the delay elements of the last stage to the delay elements of the first stage in the histogram in FIG. 6. Note that the result obtained by the above calculation will be referred to as the cumulative detection count (vertical axis in FIG. 7).

Figure 8:
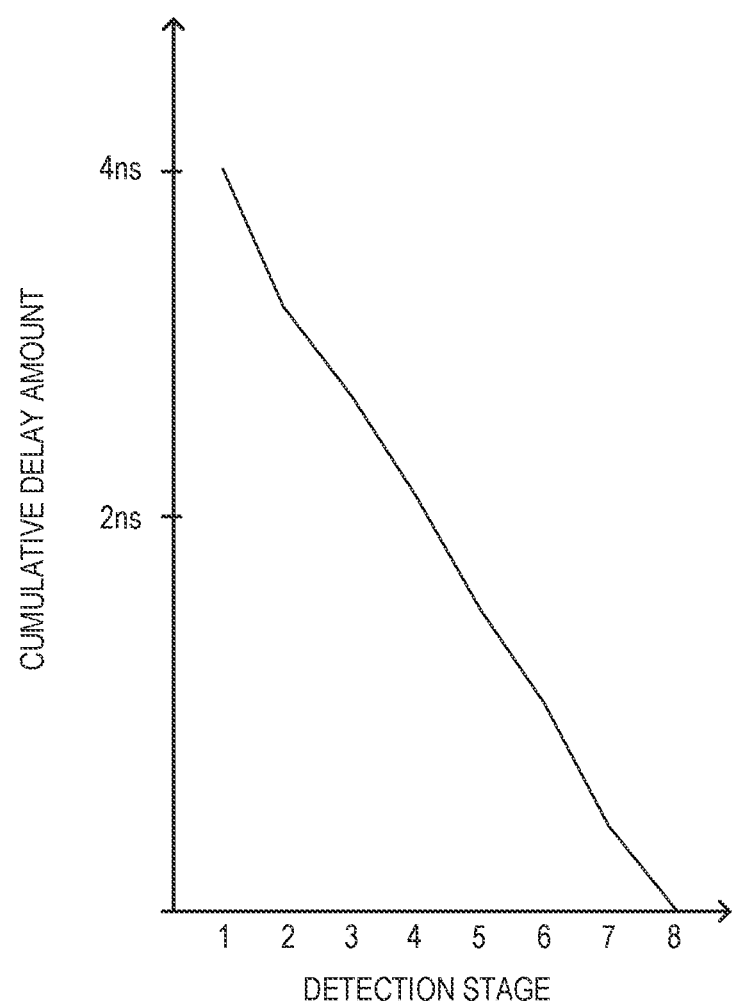
FIG. 8 shows a delay conversion table.

Next, the table generation unit 4 generates a table in which the cumulative detection counts on the vertical axis of the cumulative histogram shown in FIG. 7 are converted into cumulative delay amounts. This table will be referred to as a delay conversion table. FIG. 8 shows a delay conversion table. In FIG. 8, a delay conversion table in the case where the period of the measurement clock is 4 [ns] is shown.

Note that the reason for performing cumulative processing from the delay elements of the last stage to the delay elements of the first stage as described above is as follows. As illustrated in FIG. 4, the delay amount from when the measurement clock B rises until when the measurement signal rises is the cumulative delay amount from the delay elements that detect the rise of the measurement signal to the delay elements of the last stage. In other words, the delay amount from when the measurement clock rises until when the measurement signal rises can be calculated, by calculating the cumulative delay amount from the delay elements of the last stage to the delay elements that detect the rise of the measurement signal. In view of this, in the present example embodiment, the cumulative delay amount of the delay elements of each stage is calculated by accumulating the delay amounts from the delay elements of the last stage to the delay elements of the first stage in order.

Calculation of the time difference (delay time of measurement signal) between the measurement light and the reflected light when the distance measuring apparatus 100 performs the distance measurement operation requires the time interval between the rise of the measurement signal and the rise of the measurement clock immediately previous to the rise of the measurement signal. The time calculation unit 5 (see FIG. 1) calculates the time difference (delay time of measurement signal) between the measurement light and the reflected light, based on the detection result of the edge detection unit 3 and the delay conversion table described above.

Specifically, the time calculation unit 5 acquires the cumulative delay amount corresponding to the detection stage of the delay elements that detect the rise of the measurement signal as the time interval from the rise of the measurement clock to the rise of the measurement signal, based on the detection result of the edge detection unit 3 (detection stage of delay elements that detect rise of measurement signal) and the delay conversion table. For example, in the case where the stage number of the delay elements that detect the rise of the measurement signal is "4", the time calculation unit 5 acquires the cumulative delay amount corresponding to the stage number "4" from the table in FIG. 8 as the time interval from the rise of the measurement clock to the rise of the measurement signal. The time calculation unit 5 then calculates the time difference between the measurement light and the reflected light, from the number of clocks of the measurement clock from when the light projecting unit 101 emits measurement light to the measurement clock (measurement clock B in FIG. 4) immediately previous to the measurement signal rising and the time interval acquired from the delay conversion table. The time calculation unit 5 outputs the calculated time difference between the measurement light and the reflected light to the distance calculation unit 6 (see FIG. 1).

The distance calculation unit 6 calculates the distance to the target, from the time difference between the measurement light and the reflected light calculated by the time calculation unit 5. The distance calculation unit 6 may be constituted by dedicated hardware or may be realized by a CPU executing a program, for example. In the present example embodiment, the distance calculation unit 6 calculates a distance d to the target with the following equation (1). Note that, in the following equation (1), C is the velocity of light and $\Delta T$ is the time difference (delay time of measurement signal) between the measurement light and the reflected light.

$$d = (1/2) \times C \times \Delta T \qquad (1)$$

(Operation and Effect of Present Example Embodiment)

Figure 9:
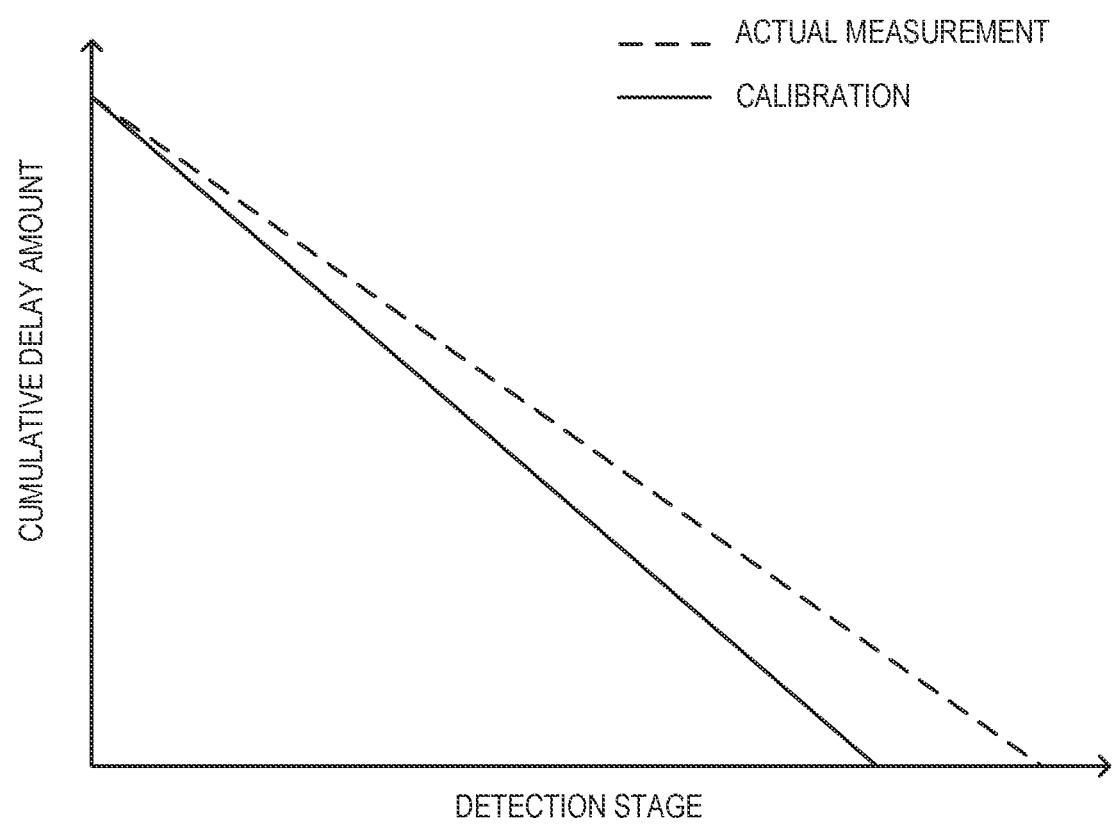
FIG. 9 is a conceptual diagram showing an example of the relationship between a detection stage of delay elements that detect the rise of the measurement signal and a cumulative delay amount at each detection stage.

FIG. 9 is a conceptual diagram showing an example of the relationship between the detection stages of the delay elements that detect the rise of the measurement signal and the cumulative delay amount of the detection stages, with the solid line showing the relationship between the detection stages and the cumulative delay amount during the calibration operation, and the dashed line showing the relationship between the detection stages and the cumulative delay amount during the measurement operation.

In the case where the voltage drop amount of the supply voltage of the TDC circuit 2 during the measurement operation of the distance measuring apparatus 100 is smaller than the voltage drop amount of the supply voltage of the TDC circuit 2 during the calibration operation, the delay amount of the delay elements during the measurement operation will be smaller than the delay amount of the respective delay elements during the calibration operation. The number of stages of delay elements corresponding to one period of the measurement clock during the measurement operation will also be larger than the number of stages of delay elements corresponding to one period of the measurement clock during the calibration operation.

As shown in FIG. 9, due to the number of stages of delay elements corresponding to one period of the measurement clock being larger during the measurement operation, the actual cumulative delay amount of each detection stage during the measurement operation will be larger than the cumulative delay amount during the calibration operation. As evident from FIG. 9, the difference (error) between the actual cumulative delay amount during the measurement operation and the cumulative delay amount during the calibration operation increases, the later the detection stage of the delay elements that detect the rise of the measurement signal.

Note that, depending on the conditions, the voltage drop amount of the supply voltage of the TDC circuit 2 during the measurement operation can be larger than the voltage drop amount during the calibration operation. In that case, the number of stages of delay elements corresponding to one period of the measurement clock during the measurement operation will be fewer than the number of stages of delay elements corresponding to one period of the measurement clock during the calibration operation. In this case also, the difference (error) between the actual cumulative delay amount during the measurement operation and the cumulative delay amount during the calibration operation will similarly increase, the later the detection stage of the delay elements that detect the rise of the measurement signal.

In this way, when measuring the distance to an arbitrary target with the distance measuring apparatus 100, the measured distance will include a large error, in the case where the detection stage of the delay elements that detect the rise of the measurement signal in the TDC circuit 2 is a later stage. In particular, the error increases as the difference between the voltage drop amount of the supply voltage of the TDC circuit 2 during the measurement operation and the voltage drop amount of the supply voltage of the TDC circuit 2 during the calibration operation increases.

In view of this, in the present example embodiment, the measurement signal input to the TDC apparatus 50 is input to the TDC circuit 2 after being delayed by the delay unit 1. In this case, the detection stage of the delay elements that detect the rise of the measurement signal can be set to an earlier stage, depending on the amount by which the measurement signal is delayed in the delay unit 1, for example. The difference (error) between the actual cumulative delay amount during the measurement operation and the cumulative delay amount during the calibration operation can thereby be reduced.

By adopting such a configuration, with the distance measuring apparatus 100 according to the present example embodiment, the distance to a target can be accurately measured while reducing the influence of variation in the voltage drop amount of the TDC circuit 2 between the calibration operation and the measurement operation.

Note that, in the present example embodiment, after the measurement signal input to the TDC apparatus 50 is delayed by the delay unit 1, the time calculation unit 5 calculates the time difference (delay time of measurement signal) between the measurement light and the reflected light, based on the delayed measurement signal. Thus, the delay time of the measurement signal that is calculated by the time calculation unit 5 will be longer by an amount corresponding to the delay in the delay unit 1, with respect to the actual time difference between the measurement light and the reflected light. Accordingly, in the case where the distance to the target is calculated directly using the delay time of the measurement signal calculated by the time calculation unit 5, the calculated distance will be longer than the actual distance. That is, an error corresponding to the delay amount in the delay unit 1 occurs in the distance measurement result of the distance measuring apparatus 100. In this regard, the distance measuring apparatus 100 according to the present example embodiment is able to avoid the occurrence of such an error by calculating the distance to the target in the following manner.

For example, the distance calculation unit 6 may calculate the distance (reference distance) to a reference object positioned at a specific distance, based on a measurement signal related to reflected light from the reference object, set a zero point of distance measurement based on the calculated reference distance, and calculate the distance to the target based on the set zero point. More specifically, for example, in the case where the position of an arbitrary object within the distance measuring apparatus 100 is set as the zero point of distance measurement, the distance calculation unit 6 may output, as the distance to the target, a value obtained by subtracting the reference distance calculated with the measurement signal related to the reflected light from the reference object from the distance calculated with the measurement signal related to the reflected light from the target. In this case, the distance that is calculated based on the measurement signal related to the reflected light from the target increases as the delay amount in the delay unit 1 increases, and the reference distance that is calculated based on the measurement signal related to the reflected light from the reference object also increases. Accordingly, as described above, the influence of the delay amount of the delay unit 1 can be removed, by subtracting the reference distance from the distance calculated based on the measurement signal related to the reflected light from the target.

Figure 10:
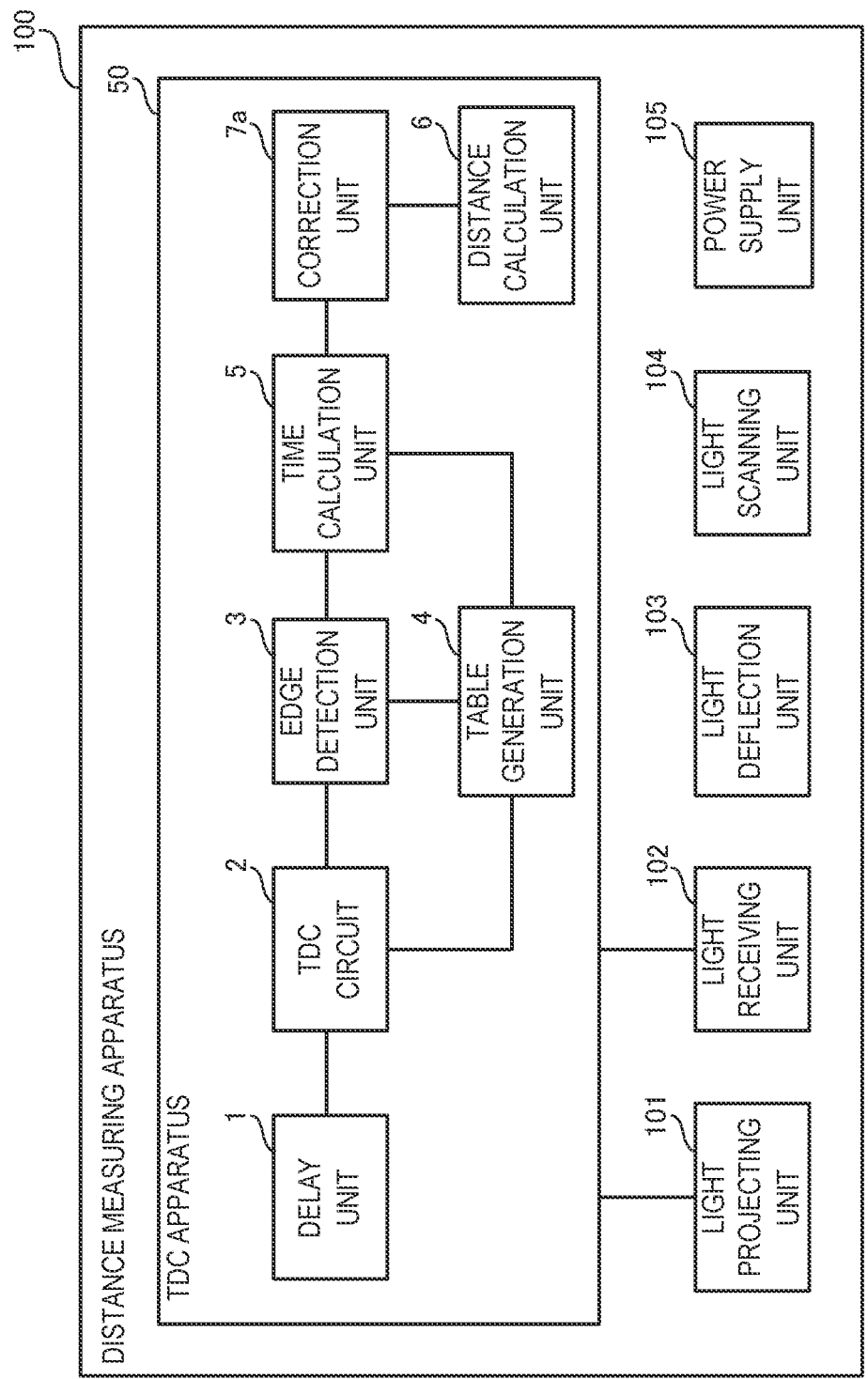
FIG. 10 shows a variation of the distance measuring apparatus according to the first example embodiment.
Figure 11:
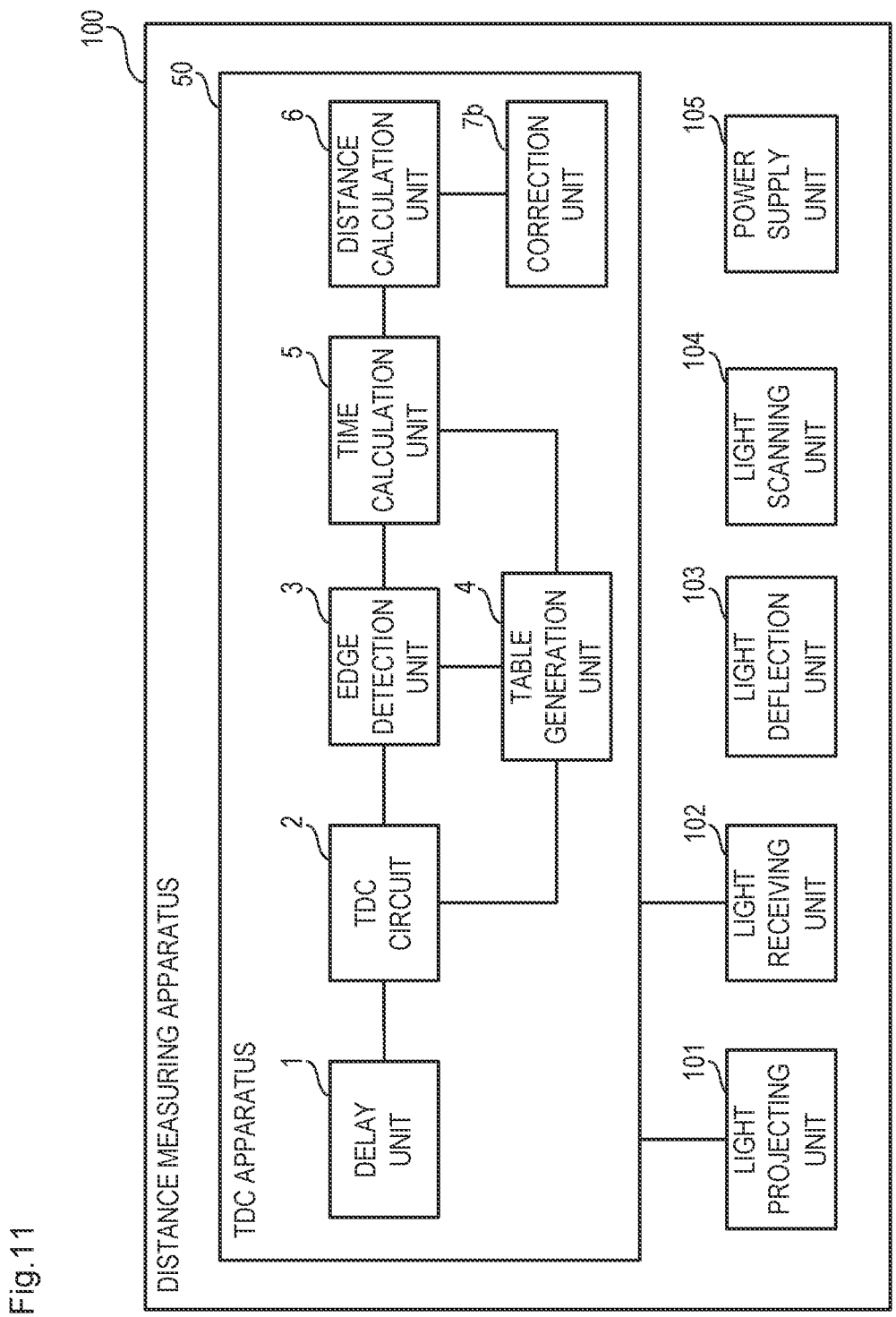
FIG. 11 shows another variation of the distance measuring apparatus according to the first example embodiment.

Also, as other methods, it is conceivable to correct the delay time of the measurement signal calculated by the time calculation unit 5 or the distance calculated by the distance calculation unit 6, for example. Hereinafter, these methods will be specifically described. FIGS. 10 and 11 are diagrams showing variations of the distance measuring apparatus 100.

In the distance measuring apparatus 100 shown in FIG. 10, the TDC apparatus 50 has a correction unit (time correction unit) 7a. In the distance measuring apparatus 100 shown in FIG. 10, the delay time of the measurement signal calculated by the time calculation unit 5 is input to the distance calculation unit 6 after being corrected by the correction unit 7a. Specifically, the correction unit 7a corrects the delay time of the measurement signal calculated by the time calculation unit 5, according to the amount by which the measurement signal is delayed in the delay unit 1. For example, in the case where the amount by which the measurement signal is delayed in the delay unit 1 is 2 [ns], the correction unit 7a subtracts a time (2 [ns]) that depends on the amount by which the measurement signal is delayed in the delay unit 1 from the delay time of the measurement signal calculated by the time calculation unit 5. The correction unit 7a outputs the delay time corrected in this manner to the distance calculation unit 6. The distance calculation unit 6 is thereby able to calculate the distance to the target, after the influence of delay of the measurement signal in the delay unit 1 has been removed.

On the other hand, in the distance measuring apparatus 100 shown in FIG. 11, the TDC apparatus 50 has a correction unit (distance correction unit) 7b. In the distance measuring apparatus 100 shown in FIG. 11, the distance to the target calculated by the distance calculation unit 6 is corrected by the correction unit 7b. Specifically, the correction unit 7b corrects the distance calculated by the distance calculation unit 6, according to the amount by which the measurement signal is delayed in the delay unit 1. For example, in the case where the amount by which the measurement signal is delayed in the delay unit 1 is 2 [ns], the correction unit 7b subtracts a distance (approx. 300 mm) that depends on the amount by which the measurement signal is delayed in the delay unit 1 from the distance calculated by the distance calculation unit 6. The influence of delay of the measurement signal in the delay unit 1 can thereby be removed from the distance calculated by the distance calculation unit 6.

Note that both the correction units 7a and 7b may be constituted by dedicated hardware or may be realized by a CPU executing a program, for example. Also, the distance measuring apparatus 100 may be provided with the correction unit 7a and the correction unit 7b. In this case, either the correction unit 7a or 7b may be operated, and thus, even if a problem such as a fault occurs in one of the correction units 7a and 7b, the influence of delay of the measurement signal in the delay unit 1 can be appropriately removed. This similarly applies to embodiments described later.

Note that the delay unit 1 may be configured to be capable of changing the delay time (delay amount) by which the measurement signal is delayed or may be configured to be incapable of changing the delay time. In the case where the delay unit 1 is configured to be able to change the delay time, the delay unit 1 may, for example, be configured to be able to adjust the delay time in the delay unit 1 according to the detection stage of the delay elements that detect the rising edge of the calibration signal in the TDC circuit 2. According to this configuration, in the case where, for example, the detection stage of the delay elements that detect the rising edge of the calibration signal in the TDC circuit 2 is a later stage during the measurement operation of the distance measuring apparatus 100, the delay time in the delay unit 1 may be adjusted, such that the detection stage of the delay elements that detect the rising edge of the calibration signal in the TDC circuit 2 is an earlier stage during the next measurement operation onward.

Note that a method such as the following is also conceivable as a method for reducing the difference (error) between the actual cumulative delay amount during the measurement operation and the cumulative delay amount during the calibration operation, utilizing the configuration of the TDC apparatus 50 according to the present example embodiment. For example, as with a distance measuring apparatus according to a second example embodiment described later (see FIG. 14), it is conceivable to provide a plurality of measurement channels (channels for measuring the delay time of the measurement signal with the measurement unit 30) in the distance measuring apparatus, and to provide the delay unit 1 in at least one thereof. In this case, by setting the delay amount in the delay unit 1 as appropriate, the detection stage of the delay elements that detect the rise of the measurement signal in one measurement channel will be different from the detection stage of the delay elements that detect the rise of the measurement signal in another measurement channel. It can thereby be expected that, even if the detection stage of the delay elements in any of the measurement channels is a later stage and the calculation result includes a large error, the detection stage of the delay elements in other measurement channels will be an earlier stage and the error included in the calculation result will be smaller. Accordingly, the influence of error can be reduced, by calculating the distance based on the average value of the delay times of the measurement signal measured by the measurement channels, for example. The influence of error can also be reduced, by taking an average value of the distances measured by the measurement channels, for example. The influence of error can also be reduced, by utilizing the calculation result of the measurement channel in which the detection stage of the delay elements that detect the rising edge of the measurement signal in the TDC circuit 2 is an earliest stage, among the plurality of measurement channels, for example.

Note that in the case where the delay unit 1 is provided in one of the plurality of measurement channels, the amount by which the measurement signal is delayed in the delay unit 1 is preferably set such that, when the rise of the measurement signal is detected in a first half stage of the delay elements in the TDC circuit 2 of one of the measurement channels, the rise of the measurement signal is detected in a latter half stage of the delay elements in the TDC circuit 2 of another of the measurement channels.

Also, even in the case where a plurality of measurement channels are not provided, the TDC apparatus 50 may be configured to be able to perform measurement multiple times for one measurement channel, while changeably setting the delay time of the measurement signal in the delay unit 1. By performing measurement multiple times while changing the delay time in the delay unit 1, the influence of error can be reduced, similarly to the case where a plurality of measurement channels are provided. For example, the influence of error can be reduced, by taking the average value of the distances obtained by performing measurement multiple times or employing the distance measured at the time at which the detection stage of the delay elements that detect the edge is an earliest stage among the distances obtained by performing measurement multiple times. Specifically, in the case where the delay unit is configured to be capable of changing the delay time by which the measurement signal is delayed, a plurality of delay times are calculated by the time calculation unit, by performing measurement multiple times while changing the delay time in the delay unit. In this case, the TDC apparatus need only be provided with a delay time determination unit that determines one delay time, based on the plurality of delay times calculated by the time calculation unit. Note that, in the case where the delay unit 1 is set to be able to change the delay time of the measurement signal in the delay unit 1, the corresponding correction unit 7a or correction unit 7b is preferably set to be able to correct the calculation result of the time calculation unit 5 or the distance calculation unit 6, according to the changed delay time.

Note that, in the above-described embodiment, the case is described where the TDC apparatus 50 is provided with the distance calculation unit 6, but the distance calculation unit 6 may be provided in the distance measuring apparatus 100 as a separate component from the TDC apparatus 50. Similarly, the table generation unit 4 may be provided in the distance measuring apparatus 100 as a separate component from the TDC apparatus 50. This similarly applies to the embodiments described below.

Also, in the above-described embodiment, the case is described where the table generation unit 4 generates the delay conversion table showing the relationship between the detection stage of the delay elements that detect the rising edge of the calibration signal and the cumulative delay amount of the delay elements up to that detection stage, but the configuration of the delay conversion table is not limited to the above-described example. In the present example embodiment, a table showing information relating to the delay amount of the plurality of delay elements of the TDC circuit 2 can be used as the delay conversion table. For example, the delay conversion table may be a table showing the delay amount of each delay element of the TDC circuit 2. In this case also, the time calculation unit 5 is similarly able to calculate the delay time of the measurement signal, based on the delay amount of each delay element shown in the delay conversion table. Also, the delay conversion table may be data that is input from outside the distance measuring apparatus 100. This similarly applies to the embodiments described below.

Second Example Embodiment

Figure 12:
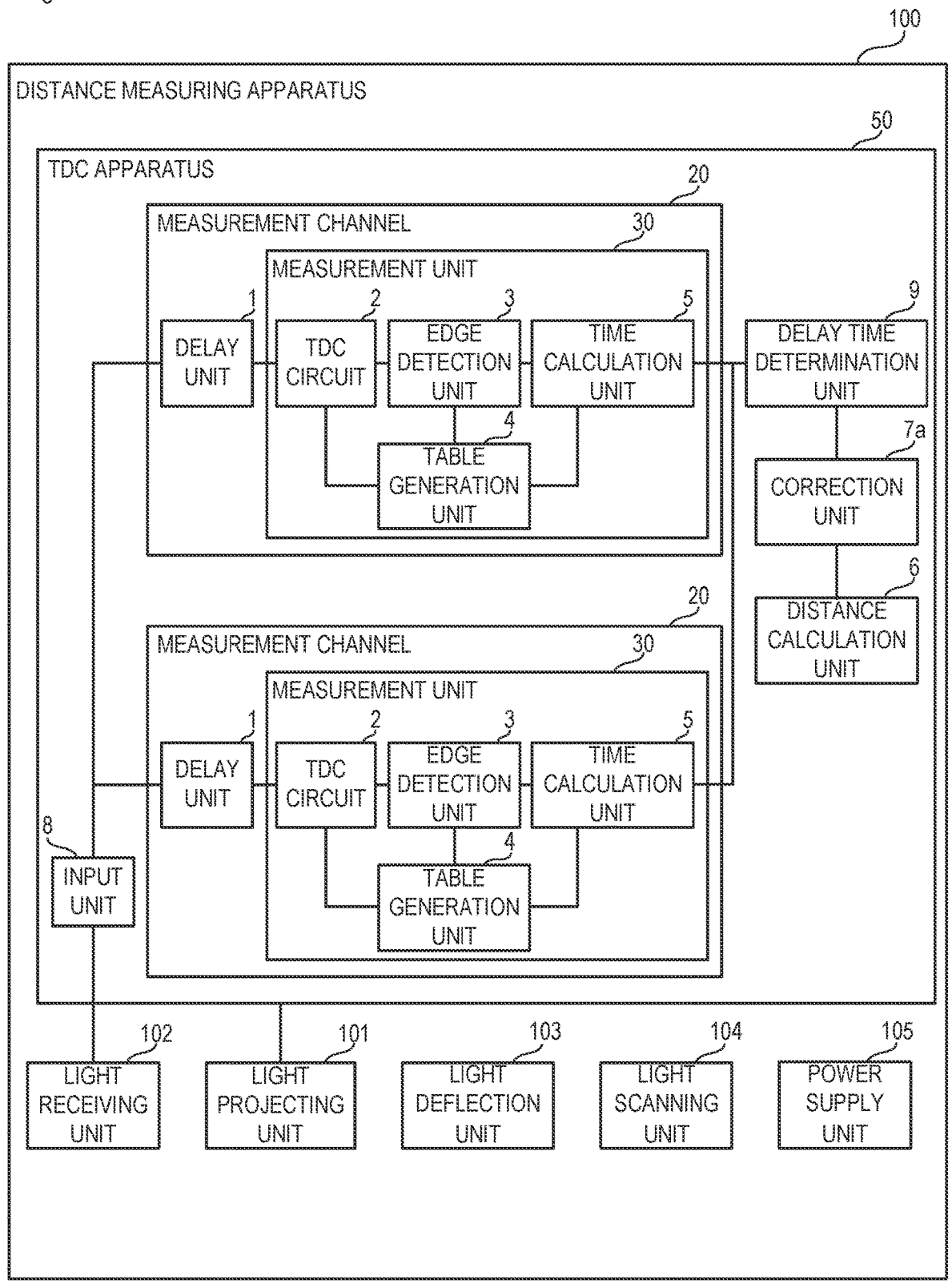
FIG. 12 is a block diagram showing the configuration of a distance measuring apparatus provided with a TDC apparatus according to a second example embodiment of the invention.

FIG. 12 is a block diagram showing the configuration of a distance measuring apparatus provided with a TDC apparatus according to a second example embodiment of the invention. Note that description of constituent elements of the distance measuring apparatus according to the second example embodiment that have a similar configuration to the distance measuring apparatus according to the first example embodiment described above will be omitted or simplified.

As shown in FIG. 12, a TDC apparatus 50 according to the present example embodiment is provided with a plurality of measurement channels 20 (two in the present example embodiment), a distance calculation unit 6, a correction unit 7a, an input unit 8, and a delay time determination unit 9. Each measurement channel 20 is provided with a delay unit 1 and a measurement unit 30. The measurement unit 30 is provided with a TDC circuit 2, an edge detection unit 3, a table generation unit 4, and a time calculation unit 5. Note that the TDC circuit 2, the edge detection unit 3, the table generation unit 4, the time calculation unit 5 and the distance calculation unit 6 have similar functions to the first example embodiment described above.

In the present example embodiment, a light receiving unit 102 outputs a measurement signal related to reflected light to the input unit 8 of the TDC apparatus 50. The input unit 8 inputs the same measurement signal input from the light receiving unit 102 in parallel to the plurality of measurement channels 20. In the present example embodiment, the input unit 8 inputs the same measurement signal to the delay unit 1 of each measurement channel 20. The input unit 8 is realized by hardware such as an electronic circuit, for example.

The delay unit 1 of each measurement channel 20 is configured similarly to the delay unit 1 of the first example embodiment described above, and is configured to delay the measurement signal input from the input unit 8 and input the delayed measurement signal to a first delay circuit 11 (see FIG. 2) of the TDC circuit 2 of the measurement unit 30. In the present example embodiment, the delay amount in each delay unit 1 is set such that the delay amount of the measurement signal is different between the delay unit 1 of one measurement channel 20 and the delay unit 1 of the other measurement channel 20. In other words, each delay unit 1 delays the measurement signal input from the input unit 8 for a different time from the other delay unit 1 and inputs the delayed measurement signal to the first delay circuit 11 of the TDC circuit 2. The measurement signal that is input to the TDC circuit 2 of one measurement channel 20 is thereby delayed with respect to the measurement signal that is input to the TDC circuit 2 of the other measurement channel 20.

The time calculation unit 5 of each measurement unit 30 calculates the delay time of the measurement signal (time difference between measurement light and reflected light), similarly to the time calculation unit 5 of the first example embodiment described above, and inputs the calculated delay time to the delay time determination unit 9.

The delay time determination unit 9 determines one delay time, based on the delay time of the measurement signal calculated by the time calculation unit 5 of each measurement channel 20. In the present example embodiment, the delay time determination unit 9 outputs, as the one delay time, an average value of the delay times calculated by the measurement channels 20. The delay time determination unit 9 may be configured by dedicated hardware or may be realized by a CPU executing a program, for example.

The correction unit 7a corrects the delay time input from the delay time determination unit 9. Here, in the present example embodiment, the time calculation unit 5 of each measurement channel 20 calculates the delay time of the measurement signal, based on the measurement signal delayed by the delay unit 1. Thus, the delay time of the measurement signal that is calculated by each time calculation unit 5 will be longer by an amount corresponding to the delay in the delay unit 1, with respect to the actual time difference between the measurement light and the reflected light. Accordingly, the average value of the delay times calculated by the time calculation units 5 will be longer than the actual time difference between the measurement light and the reflected light. In view of this, in the present example embodiment, the correction unit 7a corrects the delay time input from the delay time determination unit 9 according to the delay amount in each delay unit 1, such that the influence of the delay amount in each delay unit 1 is removed. For example, in the distance measuring apparatus 100 in FIG. 12, in the case where the delay amount of the measurement signal in one delay unit 1 is 1 [ns] and the delay amount of the measurement signal in the other delay unit 1 is 3 [ns], the correction unit 7a subtracts a time (2 [ns]=(1 [ns]+3 [ns])/2) that depends on the delay amount of the measurement signal in each delay unit 1 from the delay time of the measurement signal input from the delay time determination unit 9. The correction unit 7a outputs the delay time corrected in this manner to the distance calculation unit 6. The distance calculation unit 6 is thereby able to calculate the distance to the target, after the influence of delay of the measurement signal in each delay unit 1 has been removed.

Effect of Present Example Embodiment

In the distance measuring apparatus 100 according to the present example embodiment, each measurement channel 20 is provided with the delay unit 1. The detection stage of the delay elements that detect the rise of the measurement signal in the TDC circuit 2 can thereby be set to an earlier stage, depending on the delay amount in the delay unit 1. In this case, as described above in the first example embodiment, the difference (error) between the actual cumulative delay amount of the plurality of delay elements during the measurement operation and the cumulative delay amount of the plurality of delay elements during the calibration operation can be reduced. As a result, the error included in the distance that is calculated by the distance calculation unit 6 can be reduced.

Also, in the distance measuring apparatus 100 according to the present example embodiment, the input timing (input timing with respect to the measurement clock) of the measurement signal that is input to the TDC circuit 2 of one measurement channel 20 is shifted from the input timing of the measurement signal that is input to the TDC circuit 2 of the other measurement channel 20. The detection stage of the delay elements that detect the rise of the measurement signal in the TDC circuit 2 of one measurement channel 20 and the detection stage of the delay elements that detect the rise of the measurement signal in the TDC circuit 2 of the other measurement channel 20 are thereby changed.

The delay time determination unit 9 then determines the average value of the delay times of the measurement signal calculated by the time calculation units 5 of the measurement channels 20 as one delay time. Furthermore, the one delay time determined by the delay time determination unit 9 is corrected by the correction unit 7a according to the delay amount of each delay unit 1, and the distance to the target is calculated by the distance calculation unit 6 based on the corrected delay time.

In this case, it can be expected that, even if the detection stage of the delay elements that detect the rise of the measurement signal in the TDC circuit 2 of one measurement channel 20 is a later stage and the calculation result includes a large error, the detection stage of the delay elements that detect the rise of the measurement signal in the TDC circuit 2 of the other measurement channel 20 will be an earlier stage and the error included in the calculation result will be smaller. Accordingly, as described above, due to the delay time determination unit 9 taking an average value of the delay times calculated by the time calculation units 5 of the measurement channels 20, the influence of error can be reduced. Note that the delay amounts of the delay units 1 whose input timing is shifted with respect to each other are preferably set such that, when the rise of the measurement signal is detected in a first half stage of the delay elements in the TDC circuit 2 of one measurement channel 20, the rise of the measurement signal is detected in a latter half stage of the delay elements in the TDC circuit 2 of the other measurement channel 20, for example.

By adopting such a configuration, with the distance measuring apparatus 100 according to the present example embodiment, the distance to the target can be measured while reducing the influence of variation in the voltage drop amount between the calibration operation and the measurement operation.

Figure 13:
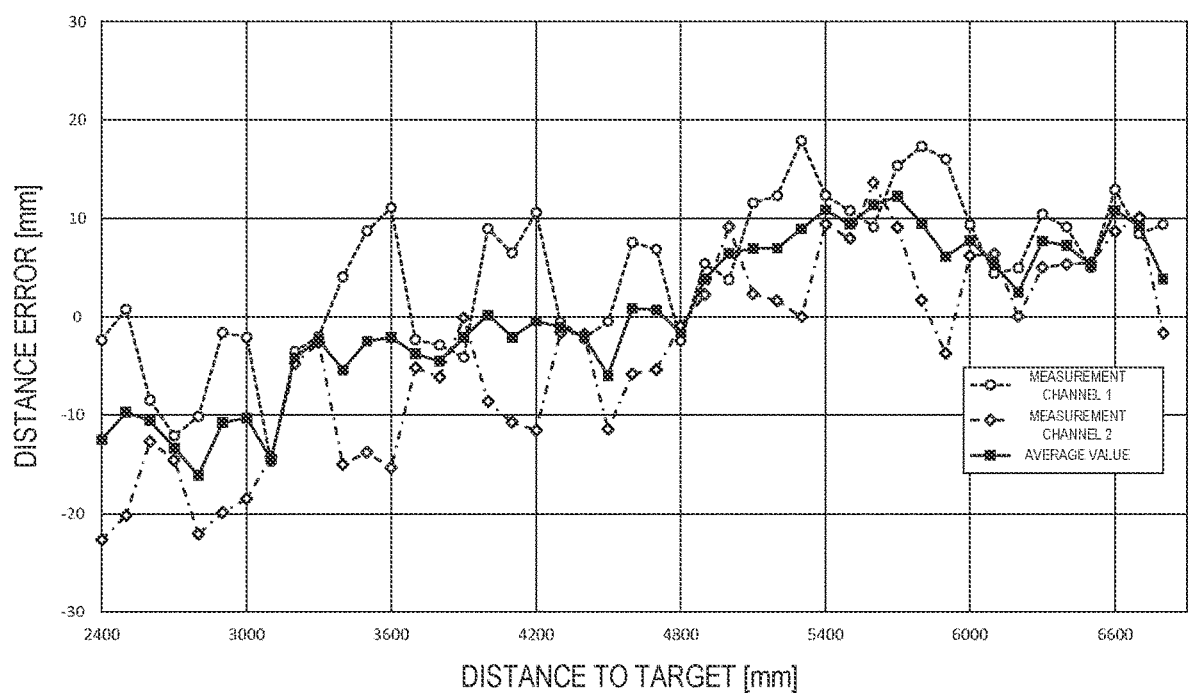
FIG. 13 is a characteristic diagram showing the effect of operations of the TDC apparatus.

FIG. 13 is a characteristic diagram showing the effect of the operations of the TDC apparatus 50 according to the present example embodiment. The horizontal axis indicates the distance from an object targeted for measurement (target), and the vertical axis indicates the error between the result of calculating the distance to the target and the actual distance to the target. Note that the characteristic diagram shown in FIG. 13 is obtained by measuring the distance to the target multiple times while changing the distance to the target by 100 mm each time. Also, the values on the vertical axis in FIG. 13 show standardized measurement errors and do not show actual measurement errors.

In FIG. 13, the dashed line indicates errors in the case where the distance to the target is calculated based on the delay time of the measurement time measured by one measurement channel 20 of the TDC apparatus 50, and the one-dot chain line indicates errors in the case where the distance to the target is calculated based on the delay time of the measurement time measured by the other measurement channel 20. Also, the solid line indicates errors in the case where the distance to the target is calculated based on the average value of the delay times of the measurement time measured by the measurement channels 20. Note that a difference of around a half period (2 [ns]) of the measurement clock is provided between the delay amount in the delay unit 1 of one measurement channel 20 and the delay amount in the delay unit 1 of the other measurement channel 20. In the calculation of the distance to the target, the influence of the delay amount in the delay units 1 has been removed.

As shown in FIG. 13, the error of the distance to the target calculated based on the delay times measured by the measurement channels 20 increases or decreases every time the distance to the target changes 600 mm. This increase/decrease in the error is conceivably caused by errors in the delay conversion table used in each measurement channel 20. On the other hand, in the case where the distance to the target is calculated based on the average value of the delay times of the measurement time measured by the measurement channels 20, variation of the error is reduced.

From the results shown in FIG. 13, it is evident that variation in measurement error can be reduced, by changing the input timing of the measurement signal that is input to the TDC circuits 2 of the measurement channels 20, and calculating the distance to the target based on the average value of the delay times of the measurement signal measured by the measurement channels 20, as with the TDC apparatus 50 according to the present example embodiment. A greater effect can be expected by increasing the number of measurement channels 20 in which the delay amount of the measurement signal that is input to the TDC circuit 2 has been adjusted.

Figure 14:
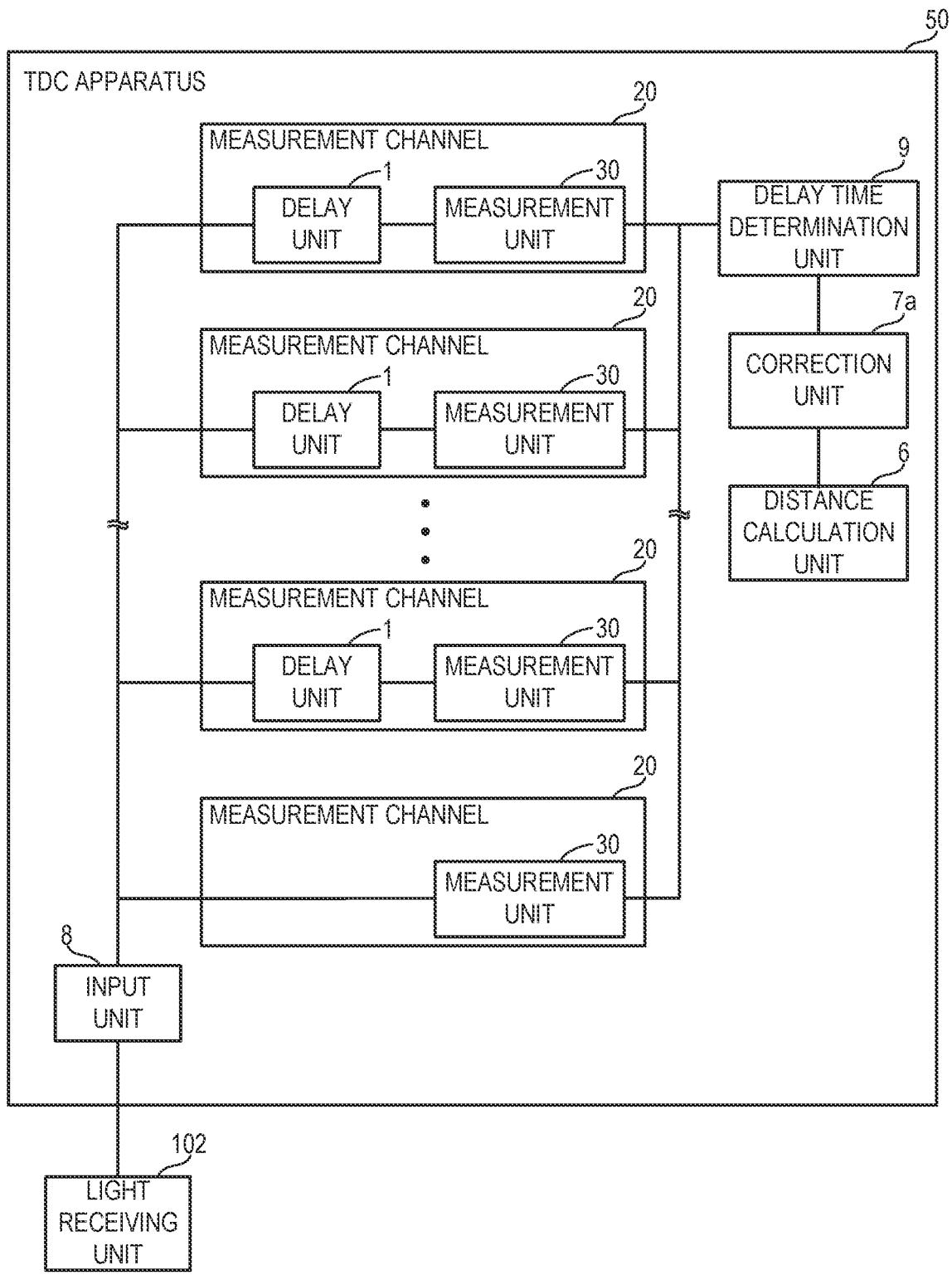
FIG. 14 is a flowchart showing a variation of the TDC apparatus according to the second example embodiment.

Note that, in the TDC apparatus 50 shown in FIG. 12, each measurement channel 20 is provided with the delay unit 1, but a configuration may be adopted in which one of the measurement channels 20 is not provided with the delay unit 1, as with the TDC apparatus 50 shown in FIG. 14. For example, in the TDC apparatus 50 shown in FIG. 12, in the case where one of the measurement channels 20 is not provided with the delay unit 1, the amount by which the measurement signal is delayed in the delay unit 1 is preferably set such that, when the rise of the measurement signal is detected in a first half stage of the delay elements in the TDC circuit 2 of one measurement channel 20, the rise of the measurement signal is detected in a latter half stage of the delay elements in the TDC circuit 2 of the other measurement channel 20.

Also, the TDC apparatus 50 shown in FIG. 12 is provided with two measurement channels 20, but, as shown in FIG. 14, the TDC apparatus 50 may be provided with three or more measurement channels 20. As described above, it is expected that the effect of the invention will be further enhanced by increasing the number of measurement channels 20. Note that, even in the case where three or more measurement channels 20 are provided, each measurement channel 20 may be provided with the delay unit 1, similarly to the TDC apparatus 50 shown in FIG. 12, or one of the measurement channels 20 may not be provided with the delay unit 1, as shown in FIG. 14. Even in the case where the TDC apparatus 50 is provided with three or more measurement channels 20, the delay amounts of the measurement signal in the delay units 1 are adjusted, such that the input timings of the measurement signal input to the TDC circuits 2 (see FIG. 12) of the measurement channels 20 are shifted from each other. Note that the delay amount of each delay unit 1 is set according to, for example, the number of measurement channels 20 provided in the TDC apparatus 50. For example, a time obtained by dividing the time corresponding to one period of the measurement clock by the number of measurement channels 20 provided in the TDC apparatus 50 can be taken as a reference delay amount, and the delay amount of the delay unit 1 of each measurement channel 20 can be set, such that the input timings of the measurement signal that is input to the TDC circuits 2 of the measurement channels 20 are shifted from each other by the reference delay amount.

Figure 15:
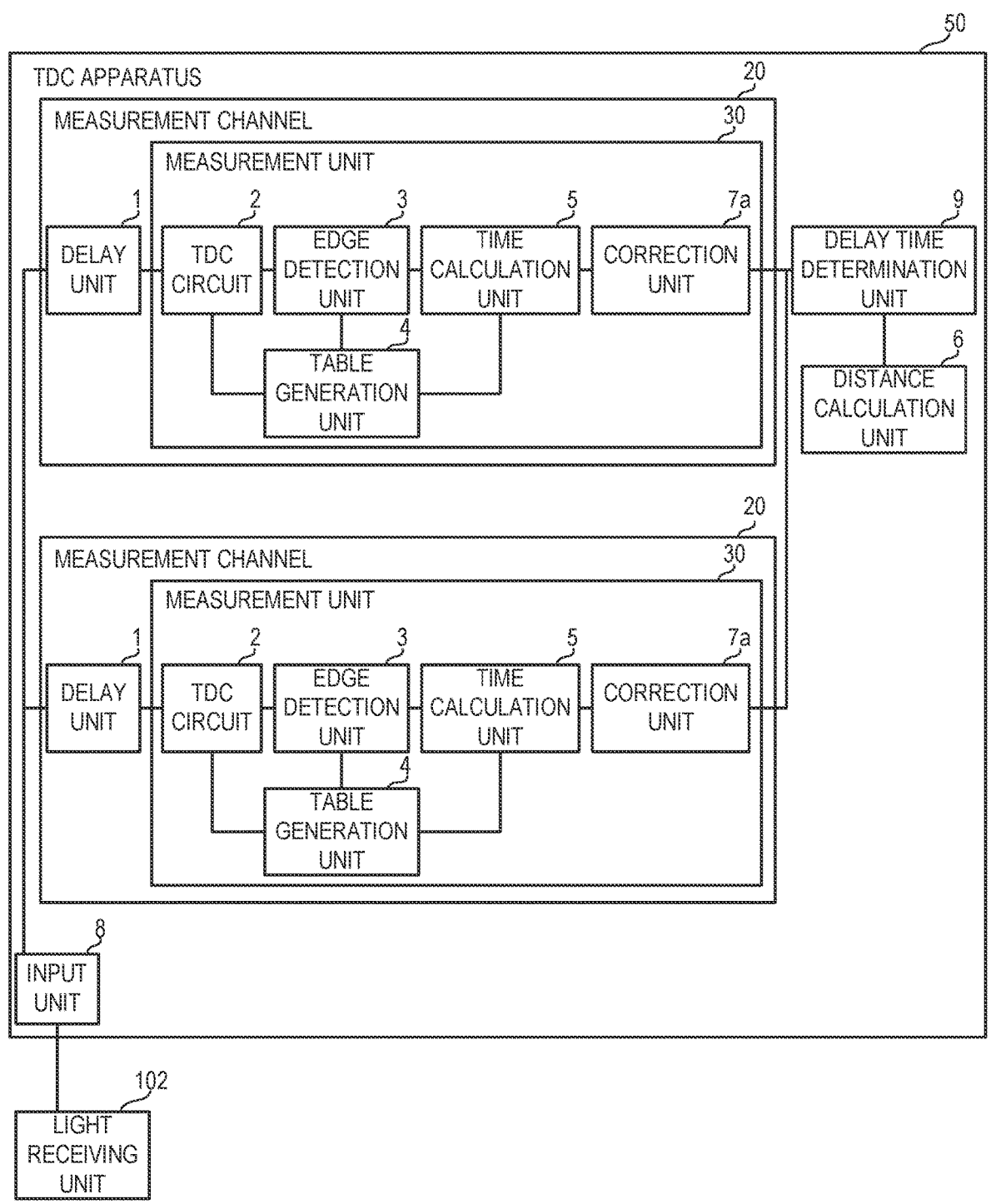
FIG. 15 shows another variation of the TDC apparatus according to the second example embodiment.

In the TDC apparatus 50 shown in FIGS. 12 and 14, the distance to the target is calculated by the distance calculation unit 6, after the correction unit 7a has corrected the one delay time output by the delay time determination unit 9, but the method of calculating the distance to the target is not limited to the example described above. For example, as shown in FIG. 15, a correction unit 7a may be provided in the measurement unit 30 of each measurement channel 20 that includes the delay unit 1. In this case, the correction unit 7a corrects the delay time of the measurement signal calculated by the time calculation unit 5, according to the amount by which the measurement signal is delayed in the delay unit 1, similarly to the correction unit 7a of the TDC apparatus 50 illustrated in FIG. 10. Each measurement channel 20 is thereby able to output a delay time of the measurement signal (time difference from the reception time of reflected light) from which the influence of delay in the delay unit 1 is removed. In this case, the one delay time that is determined by the delay time determination unit 9 is a delay time from which the influence of the delay in the delay unit 1 is removed. Accordingly, the distance calculation unit 6 is able to calculate the distance to the target, directly using the delay time output by the delay time determination unit 9 without correction.

In the above-described embodiment, the case is described where the delay time determination unit 9 determines the average value of the delay times calculated by the plurality of measurement channels 20 as one delay time, but the method of determining the one delay time by the delay time determination unit 9 is not limited to the above-described example. Specifically, the delay time determination unit 9 may, for example, determine, as the one delay time, the delay time of the measurement signal calculated by the measurement channel 20 in which the detection stage of the delay elements that detected the rising edge of the measurement signal in the TDC circuit 2 is an earliest stage, among the plurality of measurement channels 20. Note that, as described using FIG. 9, the difference (error) between the actual cumulative delay amount during the measurement operation and the cumulative delay amount during the calibration operation increases, the later the detection stage of the delay elements that detect the rising edge of the measurement signal. In other words, the difference (error) between the actual cumulative delay amount during the measurement operation and the cumulative delay amount during the calibration operation decreases, the earlier the stage of the delay elements that detect the rising edge of the measurement signal. Accordingly, the influence of variation in the voltage drop amount between the calibration operation and the measurement operation can be sufficiently reduced, due to the delay time determination unit 9 selecting the delay time calculated by the measurement channel 20 in which the detection stage of the delay elements that detect the rising edge of the measurement signal in the TDC circuit 2 is an earliest stage, among the delay times calculated by the plurality of measurement channels 20.

Figure 16:
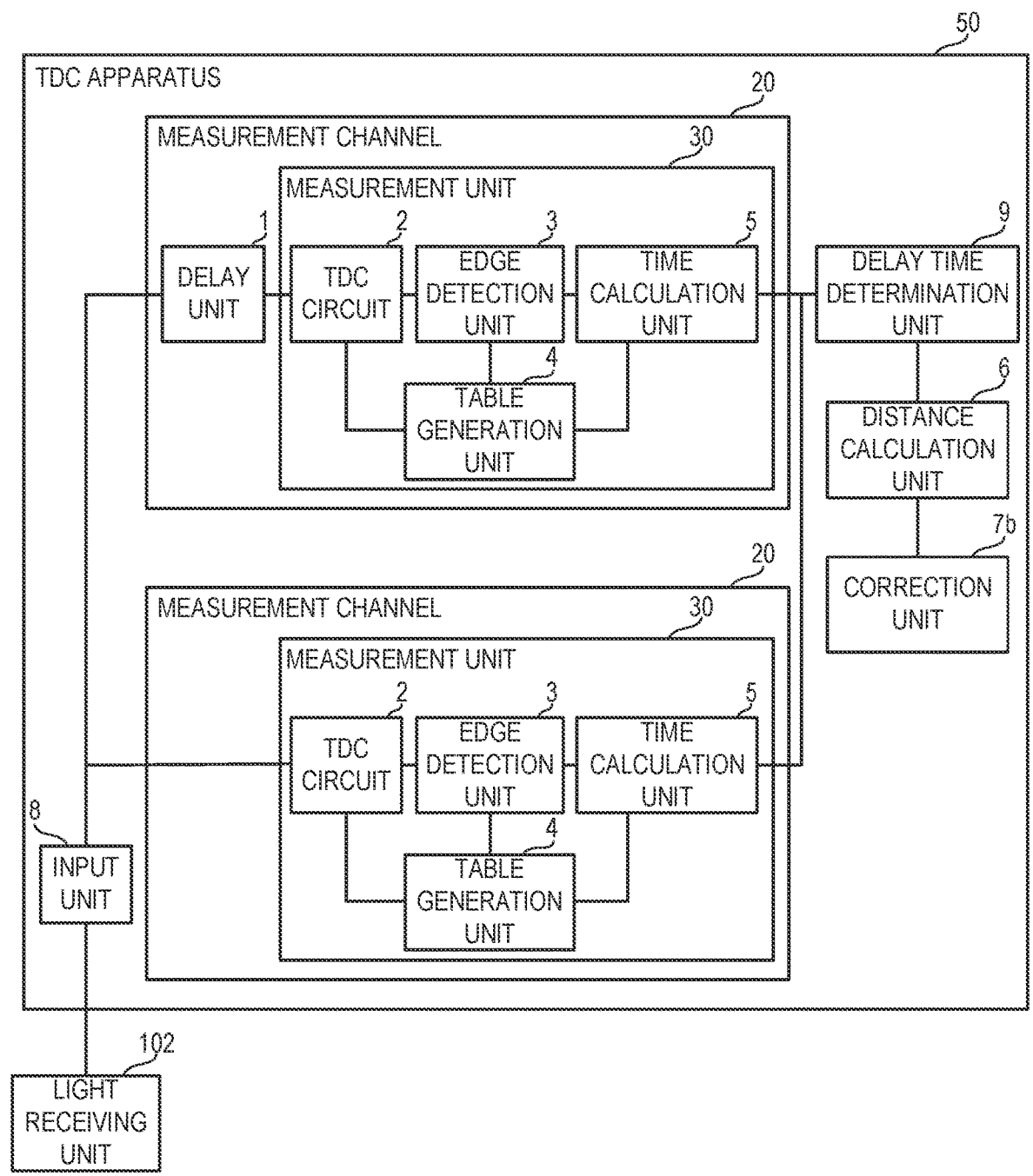
FIG. 16 shows yet another variation of the TDC apparatus according to the second example embodiment.

Note that the TDC apparatuses 50 shown in FIGS. 12 and 14 may be provided with a correction unit 7b for correcting the distance to the target calculated by the distance calculation unit 6, as shown in FIG. 16, instead of the correction unit 7a for correcting the delay time of the measurement signal. Although a detailed description is omitted, as illustrated in FIG. 11, the correction unit 7b corrects the distance calculated by the distance calculation unit 6, according to the amount by which the measurement signal is delayed in the delay unit 1, such that the influence of delay of the measurement signal in the delay unit 1 can be removed from the distance calculated by the distance calculation unit 6.

Third Example Embodiment

Figure 17:
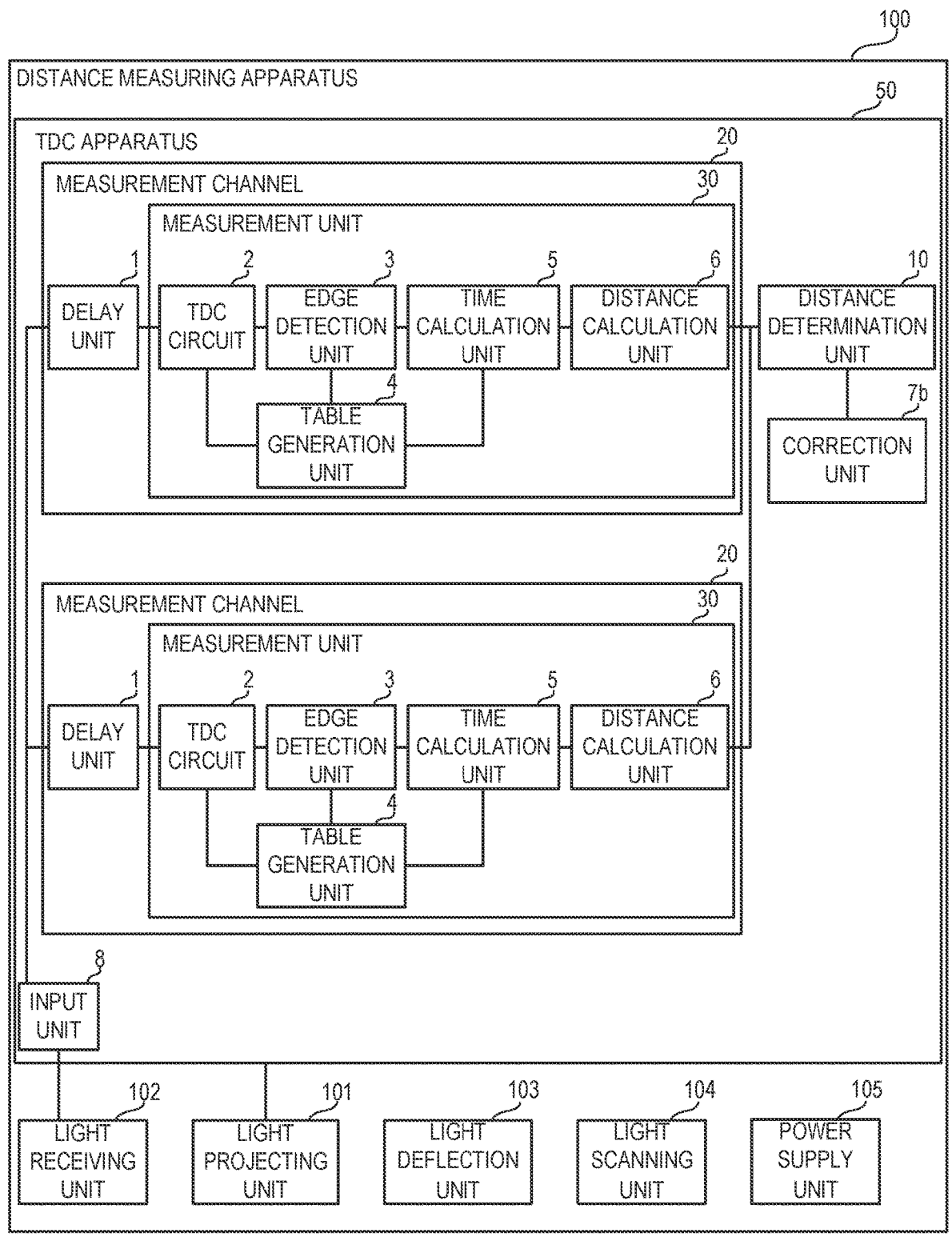
FIG. 17 is a block diagram showing the configuration of a distance measuring apparatus provided with a TDC apparatus according to a third example embodiment of the invention.

FIG. 17 is a block diagram showing the configuration of a distance measuring apparatus including a TDC apparatus according to a third example embodiment of the invention. Note that description of constituent elements of the distance measuring apparatus according to the third example embodiment that have a similar configuration to the distance measuring apparatuses according to the first and second example embodiments described above will be omitted or simplified.

As shown in FIG. 17, a TDC apparatus 50 according to the present example embodiment is provided with a plurality of measurement channels 20 (two in the present example embodiment), an input unit 8, a distance determination unit 10, and a correction unit 7b. Each measurement channel 20 is provided with a delay unit 1 and a measurement unit 30. The measurement unit 30 is provided with a TDC circuit 2, an edge detection unit 3, a table generation unit 4, a time calculation unit 5, and a distance calculation unit 6. Note that the TDC circuit 2, the edge detection unit 3, the table generation unit 4, the time calculation unit 5 and the distance calculation unit 6 are configured similarly to the distance measuring apparatus 100 illustrated in FIG. 11.

In the present example embodiment, similarly to the second example embodiment illustrated in FIG. 12, a light receiving unit 102 outputs a measurement signal related to reflected light to the input unit 8 of the TDC apparatus 50, and the input unit 8 inputs the same measurement signal input from the light receiving unit 102 in parallel to the plurality of measurement channels 20.

The delay unit 1 of each measurement channel 20, similarly to the second example embodiment illustrated in FIG. 12, delays the measurement signal input from the input unit 8 and inputs the delayed measurement signal to the first delay circuit 11 (see FIG. 2) of the TDC circuit 2 of the measurement unit 30. In the present example embodiment, each delay unit 1 similarly delays the measurement signal input from the input unit 8 for a different time from the other delay unit 1 and inputs the delayed measurement signal to the first delay circuit 11 of the TDC circuit 2.

The distance calculation unit 6 of each measurement unit 30 calculates the distance to the target, from the delay time of the measurement signal (time difference between measurement light and reflected light) calculated by the time calculation unit 5, similarly to the distance calculation unit 6 in FIG. 11. The distance calculation unit 6 inputs the calculated distance to the target to the distance determination unit 10.

The distance determination unit 10 determines one distance, based on the distance to the target calculated by the distance calculation unit 6 of each measurement channel 20. In the present example embodiment, the distance determination unit 10 outputs, as the one distance, an average value of the distances to the target calculated by the measurement channels 20. The distance determination unit 10 may be configured by dedicated hardware or may be realized by a CPU executing a program, for example.

The correction unit 7b corrects the one distance determined by the distance determination unit 10, according to the amount by which the measurement signal is delayed in the delay unit 1, such that the influence of delay of the measurement signal in the delay units 1 can be removed from the one distance determined by the distance determination unit 10. For example, the correction unit 7b may subtract a distance (value converted to an average value) corresponding to the delay amounts of the delay units 1 from the average value calculated by the distance determination unit 10. The influence of delay of the measurement signal in the delay units 1 can thereby be removed from the one distance that is determined by the distance determination unit 10.

Effect of Present Example Embodiment

In the distance measuring apparatus 100 according to the present example embodiment, each measurement channel 20 is provided with the delay unit 1, similarly to the distance measuring apparatus 100 according to the second example embodiment described above (see FIG. 12). The detection stage of the delay elements that detect the rise of the measurement signal in the TDC circuit 2 can thereby be set to an earlier stage, depending on the delay amount in the delay unit 1. In this case, as described above, the difference (error) between the actual cumulative delay amount of the plurality of delay elements during the measurement operation and the cumulative delay amount of the plurality of delay elements during the calibration operation can be reduced. As a result, the error included in the distance that is calculated by the distance calculation unit 6 can be reduced.

Also, in the distance measuring apparatus 100 according to the present example embodiment, the input timing (input timing with respect to the measurement clock) of the measurement signal that is input to the measurement unit 30 of one measurement channel 20 is shifted from the input timing of the measurement signal that is input to the measurement unit 30 of the other measurement channel 20, similarly to the distance measuring apparatus 100 according to the second example embodiment described above (see FIG. 12). The detection stage of the delay elements that detect the rise of the measurement signal in the TDC circuit 2 of one measurement channel 20 and the detection stage of the delay elements that detect the rise of the measurement signal in the TDC circuit 2 of the other measurement channel 20 are thereby changed.

The distance determination unit 10 then outputs, as the one distance, the average value of the distances to the target calculated by the distance calculation units 6 of the measurement channels 20. In this case, it can be expected that, even if the detection stage of the delay elements that detect the rise of the measurement signal in the TDC circuit 2 of one measurement channel 20 is a later stage and the calculation result includes a large error, the detection stage of the delay elements that detect the rise of the measurement signal in the TDC circuit 2 of the other measurement channel 20 will be an earlier stage and the error included in the calculation result will be smaller. Accordingly, as described above, due to the distance determination unit 10 taking the average value of the distances to the target calculated by the distance calculation units 6 of the measurement channels 20, the influence of error can be reduced. Note that the delay amounts of the delay units 1 whose input timing is shifted with respect to each other are preferably set such that, when the rise of the measurement signal is detected in a first half stage of the delay elements in the TDC circuit 2 of one measurement channel 20, the rise of the measurement signal is detected in a latter half stage of the delay elements in the TDC circuit 2 of the other measurement channel 20.

By adopting such a configuration, with the distance measuring apparatus 100 according to the present example embodiment, the distance to the target can be measured while reducing the influence of variation in the voltage drop amount between the calibration operation and the measurement operation.

Note that, in the distance measuring apparatus 100 shown in FIG. 17, the distance determination unit 10 may determine, as the one distance, the distance calculated by the measurement channel 20 in which the detection stage of the delay elements that detect the rising edge of the measurement signal in the TDC circuit 2 is the an earliest stage, among the plurality of measurement channels 20. In this case, the correction unit 7b need only subtract a distance corresponding to the delay amount of the delay unit 1 of the measurement channel 20 that calculated the one distance from the one distance determined by the distance determination unit 10.

Note that, in the TDC apparatus 50 shown in FIG. 17, each measurement channel 20 is provided with the delay unit 1, but a configuration may be adopted in which one of the measurement channels 20 is not provided with the delay unit 1, similarly to the TDC apparatus 50 shown in FIG. 14.

Also, the TDC apparatus 50 shown in FIG. 17 is provided with two measurement channels 20, but the TDC apparatus 50 may be provided with three or more measurement channels 20, similarly to the TDC apparatus 50 shown in FIG. 14. Note that a configuration in which one of the measurement channels 20 is not provided with the delay unit 1 may also be adopted in the case where three or more measurement channels 20 are provided.

In the TDC apparatus 50 shown in FIG. 17, the influence of delay of the measurement signal in the delay unit 1 is removed by the correction unit 7b, when calculating the distance to the target, but the method of removing the influence of the delay is not limited to the above-described example. For example, a correction unit 7a may be provided in each measurement channel 20 that includes the delay unit 1, as with a TDC apparatus 50 shown in FIG. 18. The correction unit 7a corrects the delay time of the measurement signal calculated by the time calculation unit 5, according to the amount by which the measurement signal is delayed in the delay unit 1, and outputs the corrected delay time to the distance calculation unit 6, similarly to the correction unit 7a illustrated in FIG. 10. The distance calculation unit 6 is thereby able to calculate the distance to the target, after the influence of delay of the measurement signal in the delay unit 1 has been removed. Note that, although a detailed description is omitted, in the distance measuring apparatus 100 shown in FIG. 18, the distance determination unit 10 may output the average value of the distances to the target calculated by the measurement channels 20 as the one distance, or may output the distance calculated by the measurement channel 20 in which the detection stage of the delay elements that detect the rising edge of the measurement signal is an earliest stage in the TDC circuit 2, among the plurality of measurement channels 20, as the one distance. This similarly applies to a distance measuring apparatus 100 shown in FIG. 19 described below.

Figure 19:
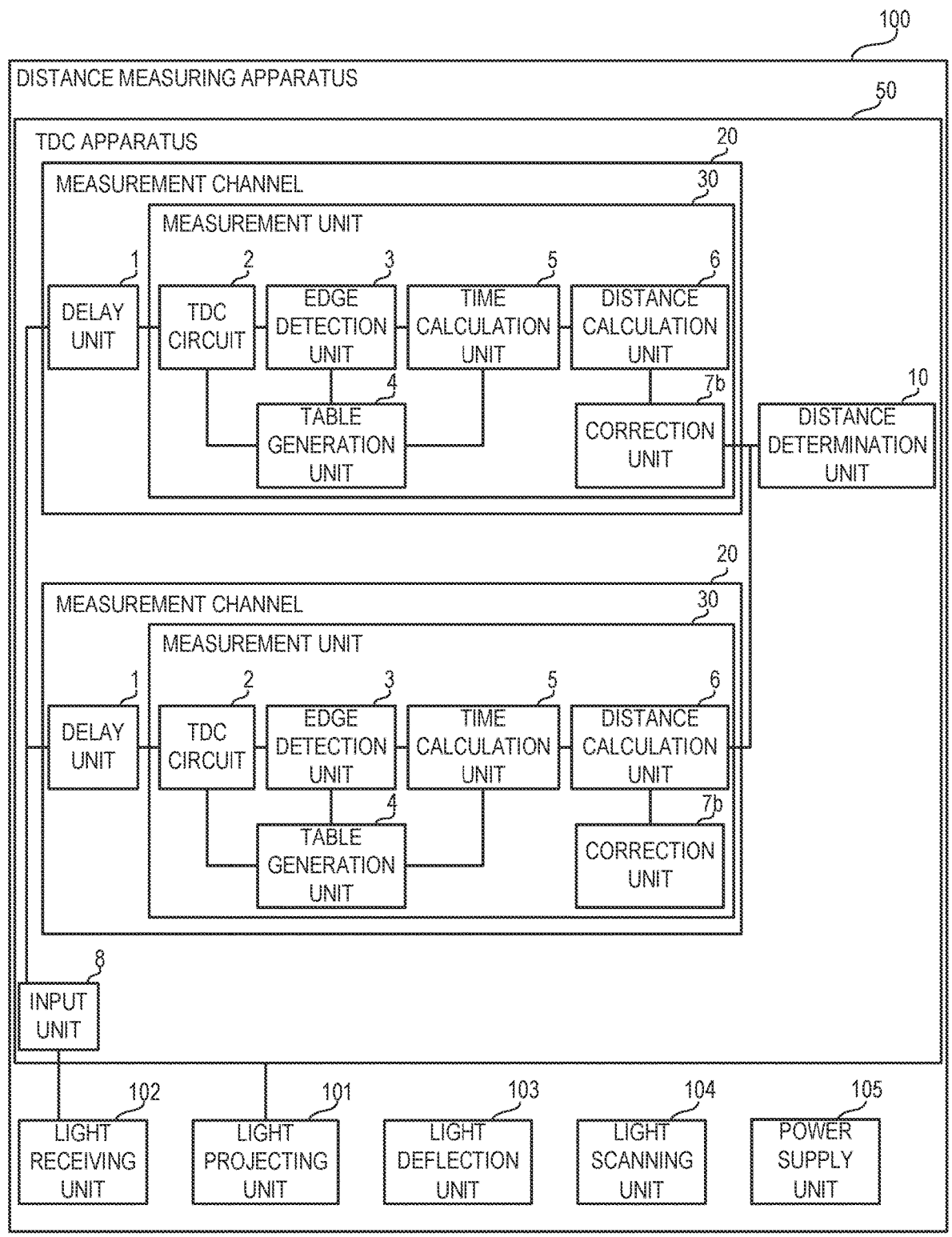
FIG. 19 shows another variation of the TDC apparatus according to the third example embodiment.

Also, for example, a correction unit 7b may be provided in each measurement channel 20 that includes the delay unit 1, as with a TDC apparatus 50 shown in FIG. 19. The correction unit 7b corrects the distance calculated by the distance calculation unit 6, according to the amount by which the measurement signal is delayed in the delay unit 1, and outputs the corrected distance to the distance determination unit 10, similarly to the correction unit 7b illustrated in FIG. 11. The one distance that is determined by the distance determination unit 10 will thereby be a distance from which the influence of delay of the measurement signal in the delay unit 1 is removed.

Figure 18:
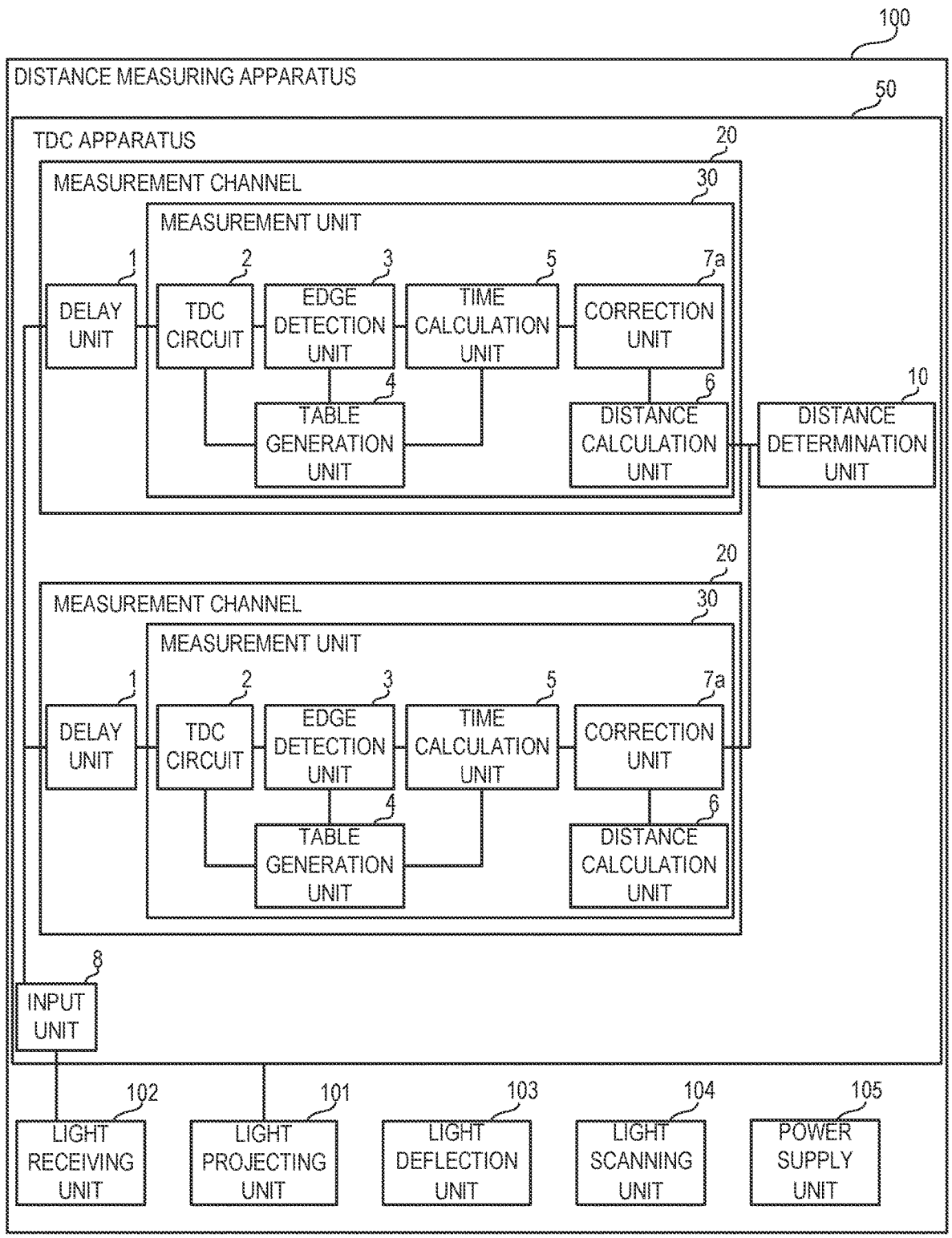
FIG. 18 shows a variation of the TDC apparatus according to the third example embodiment.

Also, in the distance measuring apparatus 100 shown in FIGS. 17 to 19, the distance calculation unit 6 of each measurement unit 30 may calculate the distance to a reference object (reference distance) positioned at a specific distance, based on a measurement signal related to reflected light from the reference object, set a zero point of the distance measurement based on the calculated reference distance, and calculate the distance to the target based on the set zero point, similarly to the first example embodiment illustrated in FIG. 1. In this case, the correction units 7a and 7b need not be provided.

LIST OF REFERENCE SIGNS

1 Delay unit
2 TDC circuit
3 Edge detection unit
4 Table generation unit
5 Time calculation unit
6 Distance calculation unit
7a, 7b Correction unit
8 Input unit
9 Delay time determination unit
10 Distance determination unit
11 First delay circuit
12 Second delay circuit
13 Flip-flop array
14 Synchronization circuit
20 Measurement channel
30 Measurement unit
50 TDC apparatus
100 Distance measuring apparatus
101 Light projecting unit
102 Light receiving unit
103 Light deflection unit
104 Light scanning unit
105 Power supply unit

The invention claimed is:

1. A TDC apparatus comprising:
a TDC circuit having:
a delay circuit including a plurality of stages of delay elements configured to sequentially delay a measurement signal; and
a plurality of storage elements provided in correspondence with the plurality of stages of delay elements, and configured to respectively hold outputs of the plurality of stages of delay elements in response to a measurement clock input thereto;
an edge detection unit configured to detect a detection stage of a delay element, among the plurality of delay elements, that detects at least a rising edge of the measurement signal, based on switching of outputs of the plurality of storage elements;
a time calculation unit configured to output a delay time of the measurement signal, based on the detection stage of the delay element and a delay conversion table relating to a delay amount of the plurality of delay elements; and
a delay unit configured to delay the measurement signal input thereto and input the delayed measurement signal to the delay circuit of the TDC circuit.

2. The TDC apparatus according to claim 1, further comprising:
a plurality of measurement channels each having the TDC circuit, the edge detection unit, and the time calculation unit;
an input unit configured to input the same measurement signal in parallel to the plurality of measurement channels; and
a delay time determination unit configured to determine one delay time based on a plurality of delay times of the measurement signal calculated by the time calculation units of the plurality of measurement channels,
wherein at least one of the plurality of measurement channels has the delay unit configured to delay the measurement signal input from the input unit, with respect to the measurement signal that is input to the delay circuit of the TDC circuit of another of the measurement channels.

3. The TDC apparatus according to claim 2,
wherein two or more measurement channels, among the plurality of measurement channels, each have the delay unit, and
each delay unit delays the measurement signal input from the input unit for a different time from the other delay units and then inputs the measurement signal to the delay circuit of the TDC circuit.

4. The TDC apparatus according to claim 2,
wherein the delay time determination unit outputs, as the one delay time, an average value of the plurality of delay times calculated by the plurality of measurement channels.

5. The TDC apparatus according to claim 2,
wherein the delay time determination unit outputs, as the one delay time, the delay time calculated by the measurement channel in which the detection stage of the delay element that detects the rising edge in the TDC circuit is an earliest stage, among the plurality of measurement channels.

6. The TDC apparatus according to claim 1, further comprising:
a time correction unit configured to correct the delay time according to a delay in the delay unit, and output the delay time that is corrected.

7. The TDC apparatus according to claim 1,
wherein the TDC apparatus is for use in a distance measuring apparatus configured to measure a distance to an object based on a measurement clock and a measurement signal related to reflected light of measurement light emitted onto the object, and
the TDC apparatus further comprises a distance calculation unit configured to calculate a distance to the object, with the delay time of the measurement signal as a time difference between the measurement light and the reflected light.

8. The TDC apparatus according to claim 7, further comprising:
a distance correction unit configured to correct the distance calculated by the distance calculation unit according to a delay in the delay unit, and output the distance that is corrected.

9. The TDC apparatus according to claim 1,
wherein the TDC apparatus is for use in a distance measuring apparatus configured to measure a distance to an object based on a measurement clock and a measurement signal related to reflected light of measurement light emitted onto the object, the TDC apparatus further comprises:
- a plurality of measurement channels each having the TDC circuit, the edge detection unit, the time calculation unit, and a distance calculation unit configured to calculate the distance to the object, with the delay time of the measurement signal output by the time calculation unit as a time difference between the measurement light and the reflected light;
- an input unit configured to input the same measurement signal in parallel to the plurality of measurement channels; and
- a distance determination unit configured to determine one distance to the object based on a plurality of distances calculated by the distance calculation units of the plurality of measurement channels, and at least one of the plurality of measurement channels has the delay unit configured to delay the measurement signal input from the input unit, with respect to the measurement signal that is input to the delay circuit of the TDC circuit of another of the measurement channels.

10. The TDC apparatus according to claim 9,
wherein two or more measurement channels, among the plurality of measurement channels, each have the delay unit, and
each delay unit delays the measurement signal input from the input unit for a different time from the other delay units and then inputs the measurement signal to the delay circuit of the TDC circuit.

11. The TDC apparatus according to claim 9,
wherein the distance determination unit outputs, as the one distance, the distance calculated by the measurement channel in which the detection stage of the delay element that detects the rising edge in the TDC circuit is an earliest stage, among the plurality of measurement channels.

12. The TDC apparatus according to claim 9,
wherein the distance determination unit outputs, as the one distance, the distance calculated by the measurement channel in which the detection stage of the delay element that detects the rising edge in the TDC circuit is an earliest stage, among the plurality of measurement channels.

13. The TDC apparatus according to claim 9, further comprising:
a distance correction unit configured to correct the distance according to a delay in the delay unit, and output the distance that is corrected.

14. The TDC apparatus according to claim 9,
wherein the distance calculation unit calculates a distance to a reference object positioned at a specific distance, based on a measurement signal related to reflected light from the reference object, sets a zero point for distance measurement based on the distance that is calculated, and calculates a distance to a target based on the zero point.

15. The TDC apparatus according to claim 1,
wherein the delay unit is configured to be capable of changing the delay time by which the measurement signal is delayed.

16. The TDC apparatus according to claim 1,
wherein the delay unit is configured to be capable of changing the delay time by which the measurement signal is delayed, and
the TDC apparatus further comprises a delay time determination unit configured to determine one delay time based on a plurality of delay times calculated by the time calculation unit, due to performing measurement multiple times while changing the delay time in the delay unit.

17. A distance measuring apparatus comprising:
the TDC apparatus according to claim 1;
a light projecting unit configured to emit measurement light in synchronization with the measurement clock; and
a light receiving unit configured to receive reflected light of the measurement light reflected by an object, and output a measurement signal related to the reflected light to the TDC apparatus.

18. The distance measuring apparatus according to claim 17, further comprising at least one of:
- a light deflection unit configured to cause the measurement light emitted from the light projecting unit to be deflected in a predetermined direction; and
- a light scanning unit configured to cause scanning of the measurement light to be scanned in a predetermined direction.

19. A distance measuring method for measuring a distance to an object in a distance measuring apparatus that includes a TDC circuit having a delay circuit including a plurality of stages of delay elements configured to sequentially delay a measurement signal related to reflected light of measurement light emitted onto the object and a plurality of storage elements provided in correspondence with the plurality of stages of delay elements and configured to respectively hold outputs of the plurality of stages of delay elements in response to a measurement clock input thereto, the method comprising:
- delaying the measurement signal and inputting it to the delay circuit of the TDC circuit;
- detecting a detection stage of a delay element, among the plurality of delay elements, that detects at least a rising edge of the measurement signal based on switching of outputs of the plurality of storage elements;
- calculating a delay time of the measurement signal based on the detection stage of the delay element and a delay conversion table relating to a delay amount of the plurality of delay elements; and
- calculating a distance to the object, with the delay time of the measurement signal as a time difference between the measurement light and the reflected light.

* * * * *